(12) United States Patent
Ishikawa

(10) Patent No.: US 7,692,884 B2
(45) Date of Patent: Apr. 6, 2010

(54) OPTICAL APPARATUS, BARREL, EXPOSURE APPARATUS, AND PRODUCTION METHOD FOR DEVICE

(75) Inventor: Mitsuo Ishikawa, Kounosu (JP)

(73) Assignee: Nikon Corporation, Tokyo (JP)

( * ) Notice: Subject to any disclaimer, the term of this patent is extended or adjusted under 35 U.S.C. 154(b) by 219 days.

(21) Appl. No.: 11/666,166

(22) PCT Filed: Oct. 24, 2005

(86) PCT No.: PCT/JP2005/019495

§ 371 (c)(1),
(2), (4) Date: Jul. 11, 2007

(87) PCT Pub. No.: WO2006/046507

PCT Pub. Date: May 4, 2006

(65) Prior Publication Data

US 2008/0055756 A1 Mar. 6, 2008

(30) Foreign Application Priority Data

Oct. 26, 2004 (JP) ............................. 2004-311482

(51) Int. Cl.
*G02C 7/02* (2006.01)
(52) U.S. Cl. ...................... 359/819; 359/811
(58) Field of Classification Search ................. 359/819, 359/811, 822, 823, 824; 403/11, 18, 20, 403/359.5
See application file for complete search history.

(56) References Cited

U.S. PATENT DOCUMENTS

| | | | |
|---|---|---|---|
| 6,043,863 A | 3/2000 | Ikeda | |
| 6,485,153 B2 | 11/2002 | Ota | |
| 6,825,998 B2 * | 11/2004 | Yoshida | 359/819 |
| 7,161,750 B2 * | 1/2007 | Takabayashi | 359/819 |
| 2004/0125353 A1 | 7/2004 | Takahashi | |
| 2004/0214483 A1 | 10/2004 | Mizuno | |

FOREIGN PATENT DOCUMENTS

| | | |
|---|---|---|
| JP | A 10-256147 | 9/1998 |
| JP | A 2002-267907 | 9/2002 |
| JP | A 2004-34101 | 12/2004 |

* cited by examiner

*Primary Examiner*—Hung X Dang
(74) *Attorney, Agent, or Firm*—Oliff & Berridge, PLC

(57) ABSTRACT

An optical system improved in weight balance and stability, comprising drive mechanisms that support, movable with respect to an outer ring, a virtual rigid body consisting of an inner ring, optical element in a shape asymmetrical with respect to the optical axis, and optical element holding members for holding the optical element and fixing it to the inner ring. The inner ring, the outer ring and drive mechanisms function as a parallel link mechanism. Balance weights are provided on the virtual rigid body such that the weight of the virtual rigid body acts uniformly on the drive mechanisms. Therefore, the optical element is not likely to vibrate when subjected to an external vibration or at adjusting. The optical system is suitable for use in an exposure system requiring high exposure accuracy.

29 Claims, 13 Drawing Sheets

OPTICAL APPARATUS, BARREL, EXPOSURE APPARATUS, AND PRODUCTION METHOD FOR DEVICE

TECHNICAL FIELD

The present invention relates to an optical apparatus, and more particularly to an optical apparatus including an asymmetrical shape optical element with respect to an optical axis, an optical element holding member for holding the optical element, and at least three support members for supporting the optical element holding member. The present invention also relates to a barrel including such an optical apparatus, an exposure apparatus including such a barrel, and a method for manufacturing a device by performing exposure with the exposure apparatus.

BACKGROUND ART

In a projection optical system of a conventional projection exposure apparatus, a plurality of optical elements constituting the projection optical system are supported by a support member by means of an optical element holding member. A conventional optical element holding member supports the peripheral portion of an optical element at three points arranged at equal angular intervals. In order to ensure the accuracy of the projection exposure apparatus, each optical element must be held stably to enable accurate adjustment of its position in the direction of the optical axis and its attitude such as the tilt angle with respect to the optical axis. Therefore, a technique has been developed to dynamically support the optical element with a movable support member, which is driven by an actuator. The support member is driven in accordance with environmental changes to finely adjust the attitude and position of the optical element in the direction of the optical axis.

There is a recent demand for a high-resolution projection exposure apparatus in order to produce highly integrated semiconductor devices. As shown in the next equation, a projection exposure apparatus has a resolution Res that depends on the wavelength $\lambda$ of the exposure light and a numerical aperture NA of a projection optical system:

Resolution Res=$k \cdot \lambda/NA$, where k is a constant.

In other words, in order to enhance the resolution of a projection exposure apparatus, the numerical aperture NA must be increased, and the wavelength of the light source must be shortened. The shortening of the light source wavelength has made progress as in a KrF excimer laser ($\lambda$=248 nm), an ArF excimer laser ($\lambda$=193 nm), and an $F_2$ excimer laser ($\lambda$=157 nm). In order to shorten the light source wavelength, optical elements are formed of a material having high transmittance such as quartz glass or calcium fluoride. Another known technique increases the transmittance by filling the interior space of a barrel with nitrogen or helium.

In order to satisfy the demand for performing fine processing, such as 45 nm process for DRAMs and 32 nm process for MPUs, EUVL (EUV Lithography) using EUV light (Extreme UltraViolet light in soft X-ray region) having a wavelength of about 5 to 20 nm is necessary. Since an ordinary optical lens or a lens formed of a material such as quartz glass or calcium fluoride cannot be used to perform EUVL, a projection optical system must be formed by using a reflection mirror arranged in a vacuum. The use of the reflection mirror makes it possible to use light having an extremely short wavelength like EUV light without reducing the transmittance. Examples of a projection optical system applicable to an exposure apparatus used for EUVL technology are described in patent document 1 and patent document 2.

Patent Document 1: U.S. Pat. No. 6,485,153

Patent Document 2: U.S. Patent Application Publication No. 2004/0125353

As for a refraction system in which optical elements, which form a projection optical system like in the prior art, are used as transmission lenses, the refraction system has a rotation-symmetric shape with respect to an optical axis. Thus, a plurality of the optical axes for the transmission lenses may be arranged along the center line of a barrel. Accordingly, if the optical elements have a satisfactory weight balance, they can be stably supported by, for example, arranging three support members at equal angular intervals along their circular peripheral portions.

However, when a reflection mirror is used as the optical element constituting a projection optical system to shorten the light source wavelength, a light path must be bent within the projection optical system. Therefore, the reflection mirror is inclined with respect to the optical axis of the optical element. In addition, the reflection mirror may be partially cutaway to form the light path. Such a cutaway portion makes the reflection mirror rotationally-asymmetrical to the optical axis.

An asymmetrical optical element will be poorly balanced even if it is supported at three points along the peripheral portion at equal angular intervals by a conventional optical element holding member. Therefore, an optical apparatus having such asymmetrical optical element lacks static and dynamic stability and is susceptible to the influence of environmental vibrations or may exhibit an unpredictable behavior during alignment adjustment of the optical elements. Thus, the conventional optical element holder has been one of factor that lowers the accuracy of a projection exposure apparatus used in an operation for manufacturing highly integrated semiconductor devices.

DISCLOSURE OF THE INVENTION

The present invention provides an optical apparatus having a satisfactory weight balance and including a stably held optical element, a barrel including such an optical apparatus, an exposure apparatus using such a barrel, and a method for manufacturing a device using such an exposure apparatus.

To achieve the above object, one aspect of the present invention provides an optical apparatus having an optical axis. The optical apparatus includes an optical element forming an asymmetrical shape with respect to the optical axis, an optical element holding member that holds the optical element, and at least three support members that support the optical element holding member. At least either one of the optical element holding member and the optical element is configured so that total weight of the optical element holding member and the optical element is applied substantially equally to the at least three support members.

In one embodiment, the at least three support members respectively support the optical element holding member at at least three support positions, and center of mass of the optical element holding member and the optical element is located within a predetermined distance from the incenter of a triangle formed by three of the at least three support positions.

In one embodiment, the at least three support members respectively support the optical element holding member at at least three support positions, and center of mass of the optical element holding member and the optical element coincides with the incenter of a triangle formed by three of the at least three support positions.

In one embodiment, the at least three support members respectively support the optical element holding member at at least three support positions, and at least either one of the optical element holding member and the optical element is configured such that a reference plane containing the three support positions, center of mass of an optical unit including the optical element holding member and the optical element with respect to the reference plane, and an intersection point between a perpendicular of the reference plane extending through the center of mass and the reference plane have a predetermined positional relationship relative to a triangle formed by the three support positions. In one embodiment, the intersection point coincides with the incenter of the triangle. In one embodiment, the intersection point is located within a predetermined distance from the incenter of the triangle. In one embodiment, the intersection point is located inside the triangle.

In one embodiment, the at least three support members respectively support the optical element holding member at at least three support positions, and at least either one of the optical element holding member and the optical element is configured such that center of mass of the optical element holding member and the optical element lies along a reference plane containing a triangle formed by three of the at least three support positions.

In one embodiment, the at least three support members respectively support the optical element holding member at at least three support positions, and at least either one of the optical element holding member and the optical element is configured such that at least one of inertia principal axes of an optical unit including the optical element holding member and the optical element is parallel to a reference plane containing the at least support positions.

In one embodiment, the at least three support members respectively support the optical element holding member at at least three support positions, and at least either one of the optical element holding member and the optical element is configured such that at least one of inertia principal axes of an optical unit including the optical element holding member and the optical element lies along a reference plane containing the at least three support positions.

In one embodiment, the at least three support members respectively support the optical element holding member at at least three support positions, and at least either one of the optical element holding member and the optical element is configured such that at least one of inertia principal axes of an optical unit including the optical element holding member and the optical element intersects with a triangle defined by three of the at least three support positions. The inertia principal axes all intersect with the triangle.

In one embodiment, at least either one of the optical element holding member and the optical element includes a balance weight.

In one embodiment, the balance weight is integrally formed with at least either one of the optical element holding member and the optical element.

Another aspect of the present invention provides an optical apparatus having an optical axis. The optical apparatus includes an optical element forming an asymmetrical shape with respect to the optical axis, an optical element holding member that holds the optical element, at least three support members that support the optical element holding member, and a balance weight arranged on at least one of the optical element holding member and the optical element.

In one embodiment, the balance weight adjusts weight balance of at least one of the optical element holding member and the optical element such that the weight of the optical element-holding member and the optical element is distributed and applied substantially equally to the at least three support members.

In one embodiment, at least either one of the optical element holding member and the optical element is configured such that weight of the optical element held by the optical element holding member is applied substantially equally to the at least three support members.

In one embodiment, the balance weight is a projecting portion integrally formed with at least one of the optical element holding member and the optical element.

In one embodiment, the balance weight is a cutaway portion formed in at least part of the optical element holding member and the optical element.

A further aspect of the present invention provides an optical apparatus having an optical axis. The optical apparatus includes an optical element forming an asymmetrical shape with respect to the optical axis, an optical element holding member that holds the optical element, and at least three support members that support the optical element holding member. The at least three support members are arranged at irregular intervals such that weight of the optical element holding member and the optical element is distributed substantially equally to the at least three support members.

The present invention also provides a barrel including the above optical apparatus. The barrel is suitable for use in an exposure apparatus for exposing an image of a pattern formed on a mask onto a substrate through a projection optical system.

The present invention further provides a device manufacturing method that includes performing exposure in a lithography operation by using an exposure apparatus.

Definitions for terms used in this specification will now be described.

The term "optical element" refers to any component for an optical equipment element made from an optical material (glass, resin, metal, or the like). In the preferred embodiments, the description will center on a reflection-type optical element (for example, a reflection mirror). However, the "optical element" may be a transmission-type (refraction type) optical element (for example, a lens, a prism, and a filter) or an optical element that partially transmits light and reflects the remaining light (for example, a half mirror and a beam splitter).

The term "optical axis of an optical element" generally refers to a center line specified for each optical element, with the line including a center of curvature of a spherical or aspherical surface of an optical element.

The term "optical axis of an optical system" refers to a rotation symmetry axis of a co-axial optical system, which is a continuous axis formed by the central axes of a series of optical elements constituting the optical system (for example, a projection optical system). In the case of a refraction-type projection optical system, "the optical axis of the optical system" is a single straight line forming the center of the light path. In the case of a reflection-type optical system, the optical axes of the optical elements do not always coincide with the optical axis of the optical system even though they do coincide sometimes. Even when the optical axes of the optical elements coincide with the optical axis of the optical system, the center line of a light path will be bent in a reflection-type optical structure such as in the preferred embodiments. Thus, the optical axes do not necessarily one another. In some reflection-type optical systems, the optical axis itself is bent.

In the case of a spherical-surface mirror, a plurality of rotation symmetry axes are conceivable and the position of the optical axes cannot be specified as a single position. In the present application, therefore, an axis that coincides with "the center line of a light path" entering an optical element is sometimes considered as the "optical axis" when "the optical axis of the optical element" cannot be specified, or when even though "the optical axis of the optical element" can be specified, it is separated far from "the optical axis of the optical system."

The term "rotation symmetrical shape" refers to a shape obtained by rotating an object about an axis by 360/n (degrees) (n is an integer of two or more, including infinity) and is identical to the original shape of the object. Such axis is referred to as a rotation symmetry axis. The term "asymmetrical shape" means a shape having no rotation symmetry axis.

The term "weight" may be either positive weight applied to a support member (pressing force applied by an optical element holding member to the support member) or negative weight. The weight is not restricted to vertical gravity but may be load resulting from rotational moment or the like derived from gravity.

The term "substantially uniform" means that although it is preferable that the loads acting on three support members are perfectly uniform, the loads acting on the three support members may differ within a range that will not affect the stability of the optical apparatus. For example, in connection with the stability of the optical apparatus, it is possible to set conditions such as the load acting on one of the support members is smaller than the sum of the loads acting on the other two support members, the maximum value of the loads acting on the three support members is two times greater or less than the minimum value, and the directions of the loads acting on the three support members being the same.

The term "static stability" refers to a characteristic in which an optical element supported by support members resists vibrations when receiving influence from environmental vibrations. The term "dynamic stability" refers to a characteristic in which the optical element does not behave in an unexpected and unpredicted manner when the optical element is displaced by the support members during alignment adjustment or the like.

The term "center of mass of the optical element held by the optical element holding member" refers to the "center of mass (herein, the "center of gravity" is considered to be at the same position as the "center of mass" since the "center of mass" is coincident with the "center of gravity" under uniform weight)" of a rigid body when it is assumed that "the optical element held by the optical element holding member" is dynamically integral (hereafter referred as the "virtual rigid body").

The term "the incenter of a triangle" means a point at which the bisectors of the three angles of a triangle intersect with each other. The incenter of a triangle is located at equal distances from the sides of the triangle and is considered as the center of motion of a rigid body supported by three support members.

BEST MODE FOR CARRYING OUT THE INVENTION

An optical apparatus according to a first embodiment of the present invention will now be described with reference to FIGS. 1 to 6.

Figure 1:
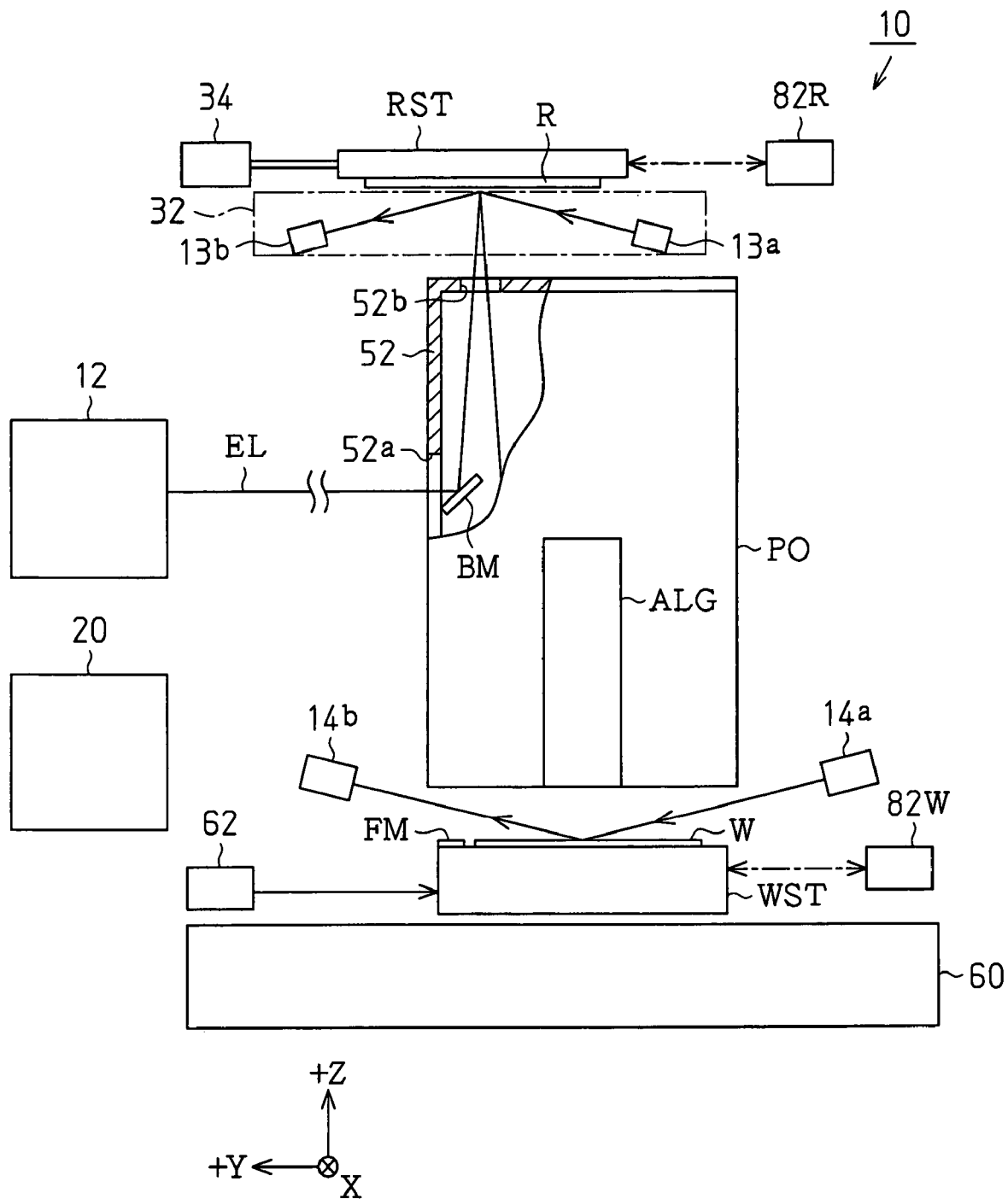
FIG. 1 is a block diagram showing an exposure apparatus according to a preferred embodiment.

FIG. 1 shows the entire structure of an exposure apparatus 10 according to the first embodiment. The exposure apparatus 10 includes a projection optical system PO. The direction of an optical axis (vertical direction) of the projection optical system PO relative to a wafer W is defined as the Z-axis direction. The lateral direction along the plane of the drawing that is orthogonal to the Z-axis direction is defined as the Y-axis direction. The direction orthogonal to the plane of the drawing is defined as the X-axis direction. In the first embodiment, the term "six degrees of freedom" means that movement in the X-axis direction ($\Delta x$), movement in the Y-axis direction ($\Delta y$), movement in the Z-axis direction ($\Delta z$), rotation about the X-axis direction ($\theta x$), rotation about the Y-axis direction ($\theta y$), and rotation about the Z-axis direction are possible.

The exposure apparatus 10 projects an image of part of a circuit pattern formed on a reticle R functioning as a mask onto a wafer W with the projection optical system PO. The reticle R and the wafer W are relatively scanned in a one-dimensional direction (the Y-axis direction) relative to the projection optical system PO so that the circuit pattern on the reticle R is entirely transferred to each of a plurality of shot regions on the wafer W by a step-and-scan method.

The exposure apparatus 10 includes a light source device 12, an illumination optical system, the projection optical system PO, a reticle stage RST, and a wafer stage WST. The light source device 12 generates EUV exposure light EL. The illumination optical system has the exposure light EL strike the patterned surface of the reticle R (the lower surface in FIG. 1 (−Z side surface)) at a predetermined incident angle of, for example, about 50 mrad. A bending mirror BM for reflecting the exposure light EL toward the patterned surface of the reticle R is arranged within a barrel 52 holding the projection optical system PO and functions as a part of an illumination optical system. The reticle stage RST holds the reticle R. The projection optical system PO projects the exposure light EL reflected by the patterned surface of the reticle R onto the surface of the wafer W that is to be exposed (the upper surface in FIG. 1 (+Z side surface)). The wafer stage WST holds the wafer W.

The light source device 12 may, for example, be a laser-excited plasma light source. A laser-excited plasma light source emits high brightness laser light to an EUV light generating material (target) to excite the target to a high-temperature plasma state and uses EUV light, ultraviolet light, visible light, and light of other wavelength bands irradiated from the target. The exposure light EL in the first embodiment is mainly an EUV light beam having a wavelength of 5 to 20 nm, for example a wavelength of 11 nm.

The illumination optical system includes an illumination mirror (not shown), a wavelength selection window (not shown), and a bending mirror BM. A parabolic mirror serving as a converging mirror in the light source device 12 functions as part of the illumination optical system. The illumination optical system illuminates the patterned surface of the reticle R with the exposure light EL transformed into an arcuate slit-shaped illumination light.

The reticle stage RST is arranged on a reticle stage base 32, which lies along an XY plane. The reticle stage RST is supported on the reticle stage base 32 by magnetic levitation force generated by, for example, a magnetic levitation type two-dimensional linear actuator constituting a reticle stage drive portion 34. The reticle stage RST is driven in the Y-axis direction within a predetermined stroke by the driving force generated by the reticle stage drive portion 34. The reticle stage RST can also be driven by a slight amount in the X-axis direction and the θz direction (the rotational direction about the Z-axis).

An electrostatic chuck type (or mechanical chuck type) reticle holder (not shown) is arranged on the lower surface of the reticle stage RST. The reticle R is held by this reticle holder. The reticle R is, for example, a reflection-type reticle adapted to the EUV exposure light EL having a wavelength of 11 nm. The reticle R is held by the reticle holder with its patterned surface facing downward. The reticle R is formed by a thin plate of silicon wafer, quartz, or low-expansion glass. In FIG. 1, a reflection film is formed on the −Z side surface (patterned surface) of the reticle R to reflect EUV light. The reflection film is a multilayer film formed by alternately superimposing a film of molybdenum Mo and a film of beryllium Be at an interval of about 5.5 nm until about 50 pairs of the films are formed. This multilayer film has a reflectance of about 70% with respect to EUV light having a wavelength of 11 nm. A multilayer film having a similar structure is formed on the reflection surface of the bending mirror BM, the mirrors M1 to M6, and other mirrors in the illumination optical system.

An absorption layer of, for example, nickel (Ni) or aluminum (Al), is applied to the entire multilayer film formed on the patterned surface of the reticle R. The absorption layer is patterned to expose the reflection film with a shape corresponding to the circuit pattern.

The EUV light striking the absorption layer of the reticle R is absorbed by the absorption layer. The EUV light irradiating the reflection film exposed by removing the absorption layer is reflected by the reflection film. The EUV light (exposure light EL) containing information of the circuit pattern is thus supplied from the patterned surface of the reticle R to the projection optical system PO.

A reticle interferometer 82R detects the position of the reticle stage RST (reticle R) along the XY plane. In the first embodiment, the reticle interferometer 82R is a reticle laser interferometer that projects a laser beam to a reflection surface provided or formed on the reticle stage RST. The reticle laser interferometer constantly detects the position of the reticle stage RST with a resolution of, for example, about 0.5 to 1 nm.

The position in the Z-axis direction of the reticle R is measured by a reticle focus sensor including an irradiation system 13*a* for obliquely emitting a detection beam to the patterned surface, and a light reception system 13*b* for receiving the detection beam reflected by the patterned surface of the reticle R.

Measured values from the reticle interferometer 82R and reticle focus sensor (13*a*, 13*b*) are provided to a main controller 20. The main controller 20 activates the reticle stage drive portion 34 based on the measured values of the reticle interferometer 82R and the reticle focus sensor (13*a*, 13*b*) to drive the reticle stage RST. The main controller 20 controls the position and attitude of the reticle R in the six-dimensional directions.

The projection optical system PO is a reflection optical system including only reflection optical elements (mirrors). The projection optical system PO has a numerical aperture NA of, for example, 0.1. The projection optical system PO has a projection ratio of, for example, ¼. Accordingly, the exposure light EL reflected by the reticle R and containing the information of the pattern formed on the reticle R is projected to the wafer W. This transfers the pattern on the reticle R to the wafer W after being reduced by ¼ in size. The structure of the projection optical system PO will be described in detail later.

The wafer stage WST is arranged on a wafer stage base 60, which lies along an XY plane, and is supported on the wafer stage base 60 by, for example, magnetic levitation force generated by a magnetic levitation type two-dimensional linear actuator constituting a wafer stage drive portion 62. The wafer stage drive portion 62 moves the wafer stage WST in the X-axis direction and the Y-axis direction within a predetermined stroke (stroke of, for example, 300 to 400 mm), while rotating the same in the θz direction for a slight amount.

An electrostatic chuck type wafer holder (not shown) is mounted on the upper surface of the wafer stage WST. The wafer holder attracts the wafer W. A wafer interferometer 82W detects the position of the wafer stage WST. The wafer interferometer 82W is, for example, a wafer laser interferometer constantly detecting the position of the wafer stage WST with a resolution of about 0.5 to 1 nm. The position of the wafer W may be detected based on the position of the wafer stage WST.

The position of the wafer W in the Z-axis direction using the image formation plane of the projection optical system PO as a reference is measured by a wafer focus sensor of a grazing-incidence type. As shown in FIG. 1, the wafer focus sensor includes an irradiation system 14*a* for emitting a detection beam to the upper surface of the wafer W in an oblique direction, and a light reception system 14*b* for receiving the detection beam reflected by the surface of the wafer W. The irradiation system 14*a* and the light reception system 14*b* are fixed to a column (not shown) holding a barrel of the projection optical system PO. The wafer focus sensor (14*a*, 14*b*) may be formed in the same manner as the reticle focus sensor (13*a*, 13*b*).

Measured values of the wafer interferometer 82W and the wafer focus sensor (14a, 14b) are provided to the main controller 20. The main controller 20 activates the wafer stage drive portion 62 to control the position and attitude of the wafer stage WST in the six-dimensional directions.

A measuring device FM is arranged at one end of the upper surface of the wafer stage WST for measuring the position on the surface of the wafer W to which the pattern formed on the reticle R is projected and the relative position with an alignment system ALG fixed to the barrel 52 (so-called baseline measurement). The reticle stage RST, the projection optical system PO, and the wafer stage WST are accommodated in a vacuum chamber (not shown).

The projection optical system PO will now be described in detail with reference to FIGS. 2 to 6.

Figure 2:
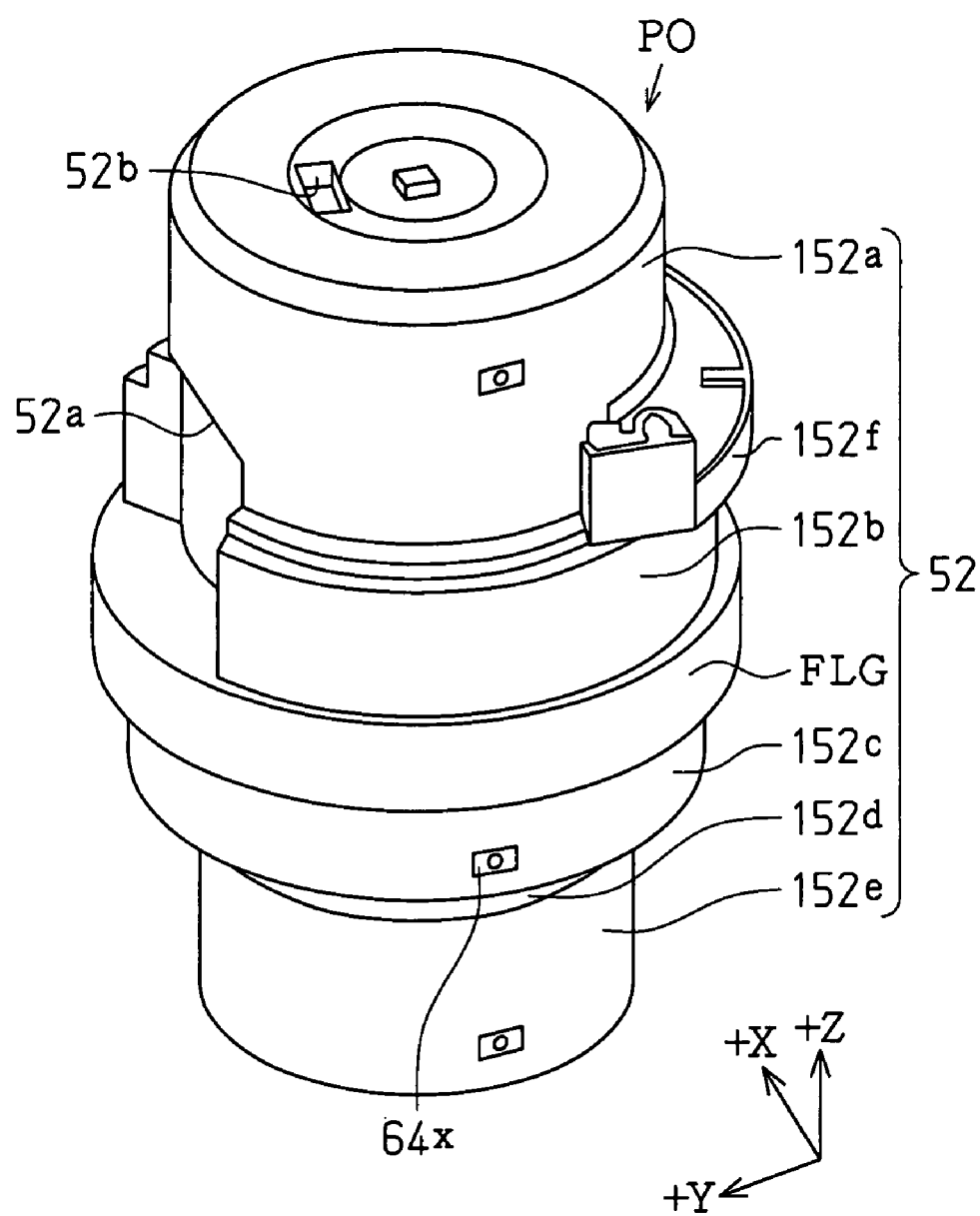
FIG. 2 is a perspective view showing a projection optical system PO.

As shown in FIG. 2, the projection optical system PO, which is arranged along the Z-axis, includes a barrel 52, which is formed from five barrel units 152a, 152b, 152c, 152d and 152e that are coupled to one another, and a flange FLG arranged between the barrel units 152b and 152c. Mirrors M1, M2, M3, M4, M5 and M6 (see FIGS. 3 and 4) are arranged in the barrel 52. An opening 52a is formed in a side wall of the barrel 52, more specifically, in the outer surface of the barrel units 152a and the barrel unit 152b to enable the entrance of the exposure light EL. The barrel units 152a to 152e and the flange FLG are formed of a material having a low degassing property such as stainless steel (SUS).

The barrel unit 152a is a cylindrical member having a rectangular through hole 52b in its upper wall (+Z side wall). A flared portion 152f is extends from the outer surface opposite the opening 52a at the lower end of the barrel unit 152a (−Z side and −Y side position).

The barrel unit 152b is formed by a cylindrical member having a slightly larger diameter than that of the barrel unit 152a and is coupled to a lower part (−Z side) of the barrel unit 152a. The flange FLG having a greater diameter than the remaining part of the barrel 52 is coupled to a lower part of the barrel unit 152b.

The barrel unit 152c is coupled to a lower part (−Z side) of the flange FLG.

The barrel unit 152d, which is formed by a cylindrical member having a slightly smaller diameter than that of the barrel unit 152c, is coupled to a lower part (−Z side) of the barrel unit 152c.

The barrel unit 152e, which is formed by a cylindrical member having a diameter slightly smaller than that of the barrel unit 152d, is coupled to a lower part (−Z side) of the barrel unit 152d. Although not shown in the drawing, the barrel unit 152e has a bottom surface having an opening to allow the passage of the exposure light EL from the projection optical system PO toward the wafer W.

Figure 3A:
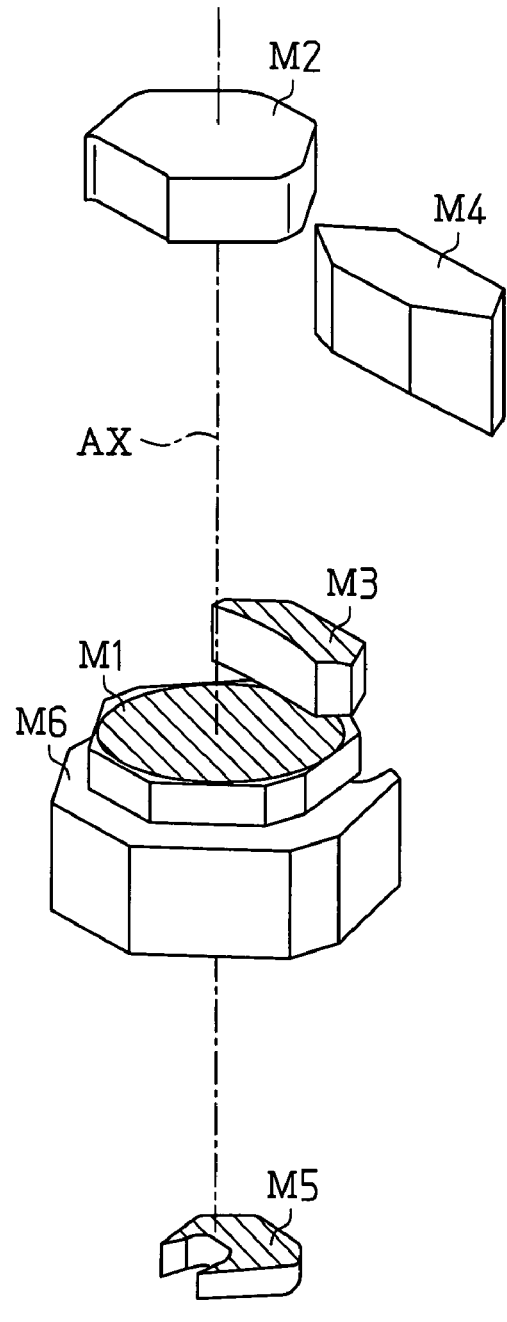
FIGS. 3A and 3B are a respective view showing mirrors M1 to M6.
Figure 3B:
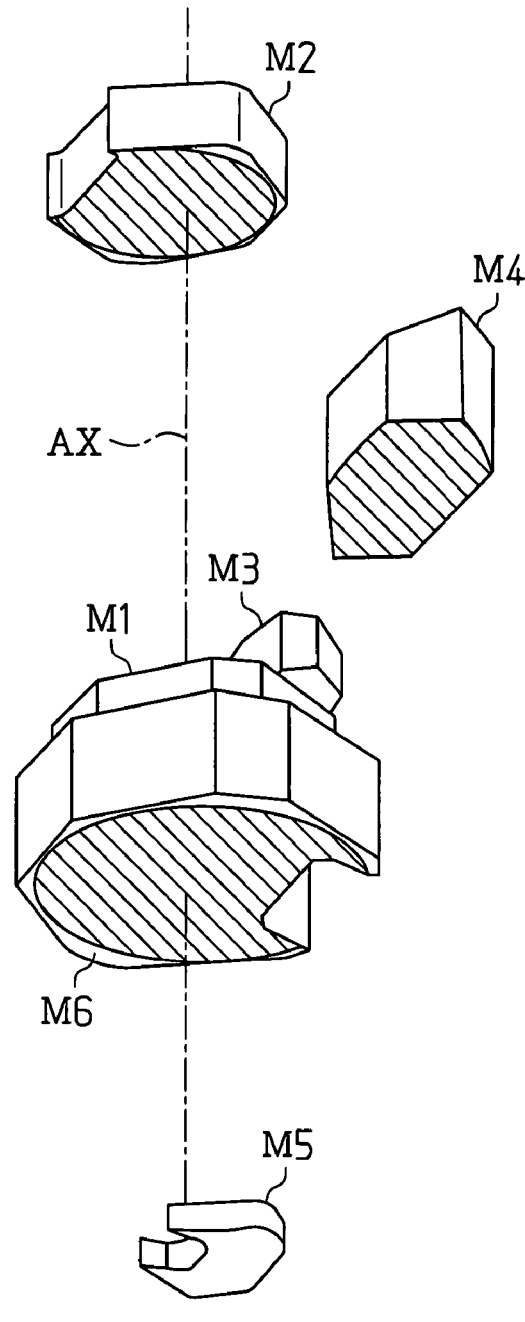
Figure 4:
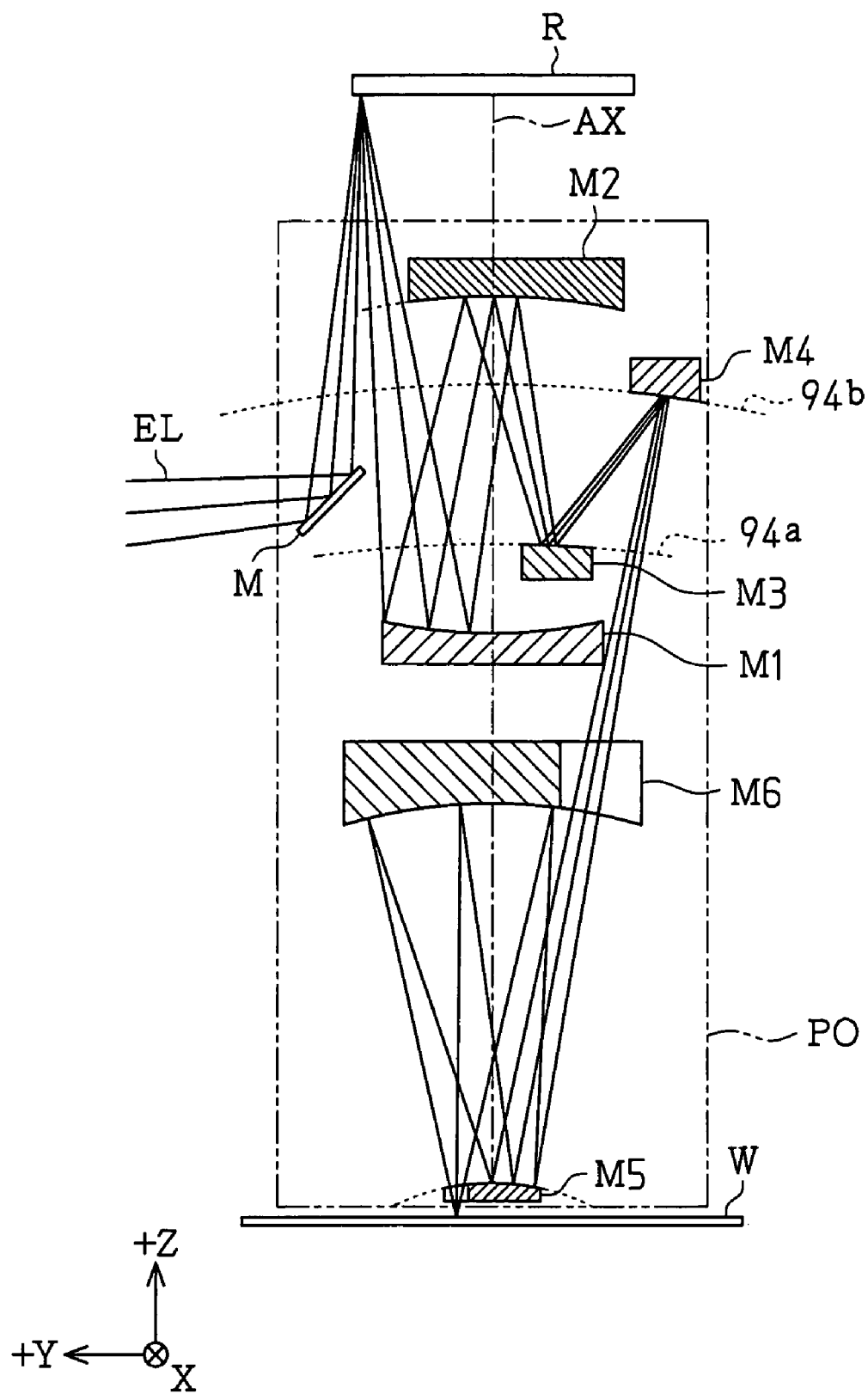
FIG. 4 is a cross-sectional view showing the projection optical system PO.

Referring to FIGS. 3 and 4, the arrangement of the optical elements (mirrors M1 to M6) in the projection optical system PO will now be described. Six mirrors M1 to M6 are arranged from the top in the order of the mirror M2, the mirror M4, the mirror M3, the mirror M1, the mirror M6, and mirror M5. The hatched portions in FIGS. 3A and 3B show the reflection surfaces of the mirrors.

In the first embodiment, the reflection surfaces of the mirrors M1 to M6 are formed with high accuracy by repeating measurement and processing of the optical properties to satisfy optical property design values. In the first embodiment, the reflection surface of each of the mirrors M1 to M6 is a smooth surface including an undulation which has been reduced to about 1/50 to 1/60 of the exposure wavelength. An RMS value (standard deviation) representing the surface roughness is 0.2 nm to 0.3 nm.

As seen from FIG. 3A and FIG. 4, the mirror M1 is a concave mirror, the upper surface of which is a rotation symmetrical reflection surface such as a spherical surface or an aspherical surface. The position of the mirror M1 is adjusted such that the rotation symmetry axis (the axis of the aspherical surface) of the reflection surface coincides with the optical axis AX of the projection optical system PO. The mirror M1 is arranged in the barrel unit 152c and held by a holding mechanism with six degrees of freedom.

The mirror M2 is a concave mirror, the lower surface of which is a rotation symmetrical reflection surface such as a spherical surface or an aspherical surface. The position of the mirror M2 is adjusted such that the rotation symmetry axis (the axis of the spherical surface or the axis of the aspherical surface) of the reflection surface coincides with the optical axis AX of the projection optical system PO. The mirror M2 is arranged in the barrel unit 152a and held by a holding mechanism with six degrees of freedom.

The mirror M3 is a convex mirror arranged at a position separated from the optical axis AX of the projection optical system PO and has an upper surface functioning as a reflection surface. As shown in FIG. 4, the reflection surface of the mirror M3 is part of a rotation symmetrical surface 94a indicated by the broken line such as a spherical surface or an aspherical surface. The position of the mirror M3 is adjusted such that the rotation symmetry axis of the surface 94a (the axis of the spherical surface or the axis of the aspherical surface) coincides with the optical axis AX. The mirror M3 is arranged in the barrel unit 152b and held by a holding mechanism with six degrees of freedom.

The mirror M4 is a concave mirror arranged at a position located far from the optical axis AX of the projection optical system PO and has a lower surface functioning as a reflection surface. As shown in FIG. 4, the reflection surface of the mirror M4 is part of a rotation symmetrical surface 94b such as a spherical surface or aspherical surface indicated by the broken line. The position of the mirror M4 is adjusted such that the rotation symmetry axis (the axis of the spherical surface or the axis of the aspherical surface) of the surface 94b coincides with the optical axis AX. The mirror M4 is held by a holding mechanism with six degrees of freedom in the barrel unit 152a shown in FIG. 2.

The mirror M5 is a generally horseshoe-shaped convex mirror having a cutaway portion and includes an upper surface functioning as a reflection surface. The reflection surface of the mirror M5 is part of a rotation symmetrical surface such as a spherical surface or aspherical surface. The position of the mirror M5 is adjusted such that the rotation symmetry axis (the axis of the spherical surface or the axis of the aspherical surface) of the reflection surface coincides with the optical axis AX of the projection optical system PO. The cutaway portion of the mirror M5 is formed in a part located at the +Y side of the optical axis AX so that the light path of the exposure light EL is not obstructed. The mirror M5 is held by a holding mechanism with six degrees of freedom in the barrel unit 152e shown in FIG. 2.

The mirror M6 is a generally horseshoe-shaped concave mirror having a cutaway portion and includes a lower surface functioning as a reflection surface. The reflection surface of the mirror M6 is part of a rotation symmetrical surface such as a spherical surface or aspherical surface. The position of the mirror M6 is adjusted such that the rotation symmetry axis (the axis of the spherical surface or the axis of the aspherical surface) of the reflection surface substantially coincides with the optical axis AX of the projection optical system PO. The notch of the mirror M6 is formed in a part located at the −Y side of the optical axis AX so that the light path of the exposure light EL is not obstructed. The mirror M6 is held by a holding mechanism with six degrees of freedom in the barrel unit 152d shown in FIG. 2. In the first embodiment, the optical axes of the mirrors M1 to M6 coincide with the optical axis AX of the projection optical system. Each of the mirrors M2 to M6 has an asymmetrical shape with respect to the optical axis of the optical element.

Figure 5:
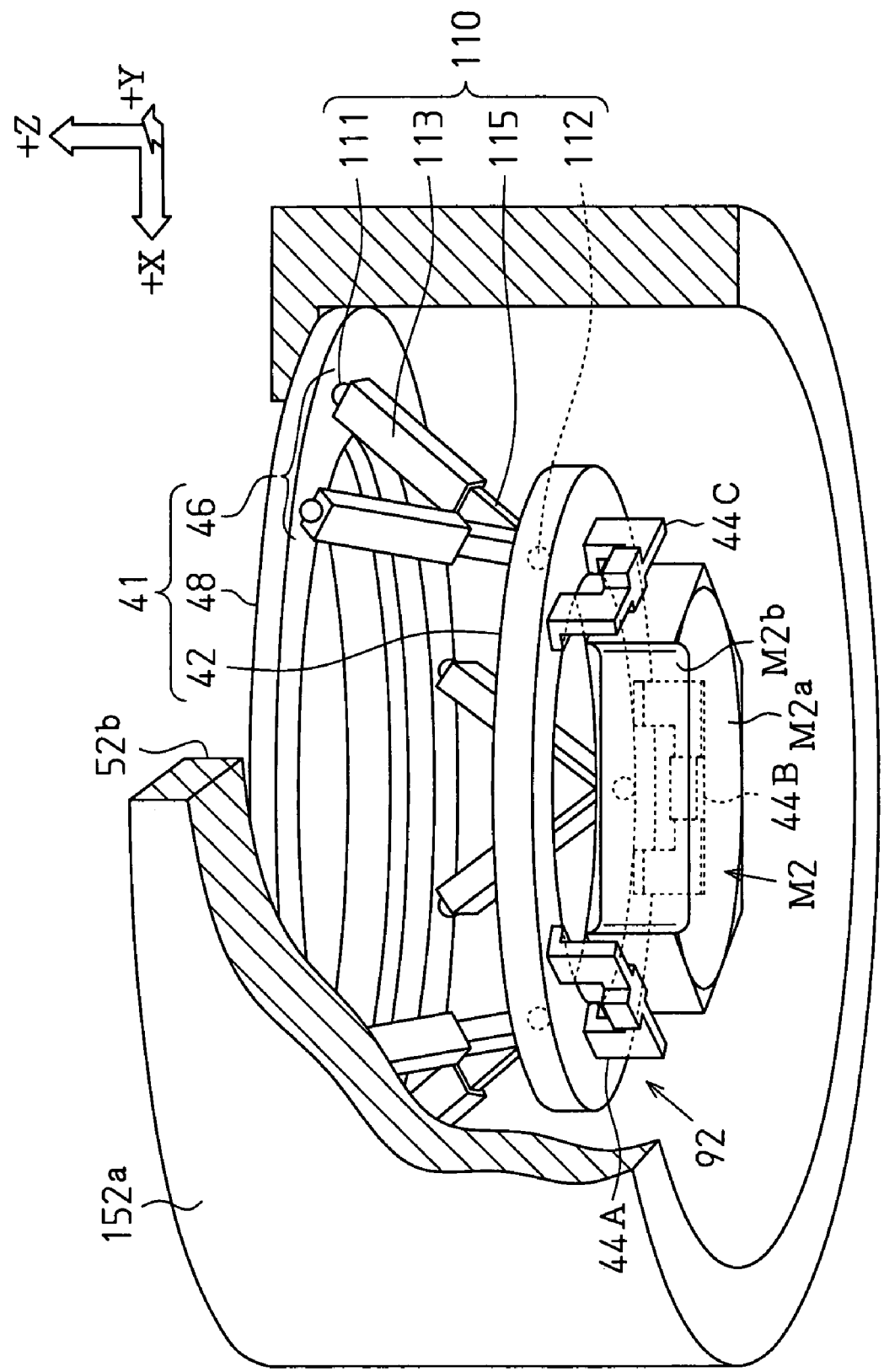
FIG. 5 is a partially cutaway perspective view showing a barrel unit.
Figure 6:
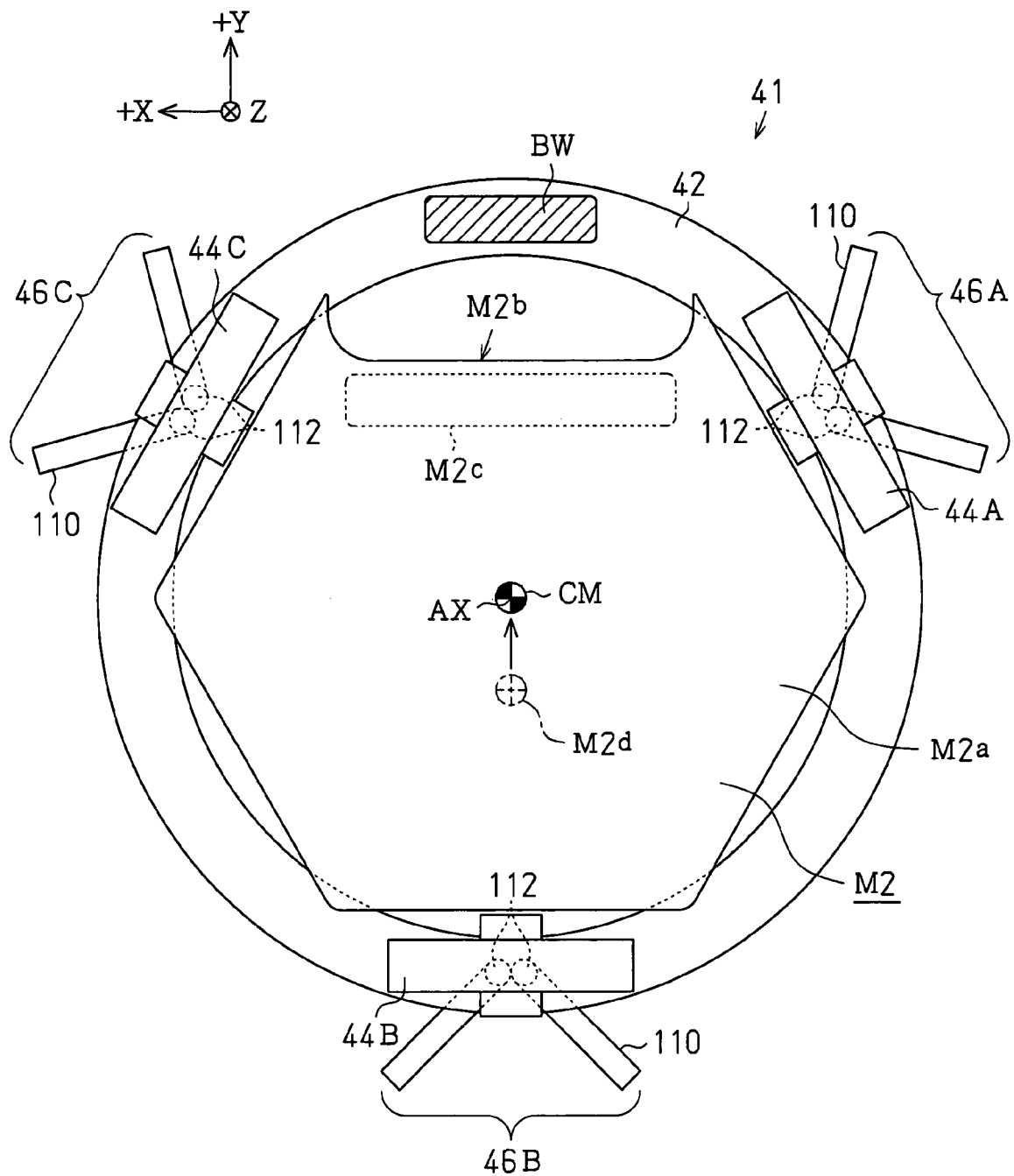
FIG. 6 is a bottom view showing a mirror holding mechanism.

Referring to FIGS. 5 and 6, a mirror holding mechanism 92 for holding the mirror M2 will now be described. Mirror holding mechanisms for holding the other mirrors M1, and M3 to M6 are the same as the mirror holding mechanism 92.

As shown in FIG. 5, the mirror holding mechanism 92 holds the mirror M2 in the barrel unit 152a. As shown in FIG. 6, the mirror M2 includes a main body portion M2a, which has an irregular polygonal shape (hexagonal shape), and a cutaway portion M2b, which provides space for the light path.

The mirror holding mechanism 92 includes mirror holding members 44A, 44B and 44C, which hold and fixing the mirror M2 to an inner ring 42, and a parallel link mechanism 41, which moves the inner ring 42. The mirror holding members 44A, 44B, and 44C are arranged on the lower surface of the inner ring 42 to support the peripheral surface of the mirror M2 at three predetermined points.

The mirror holding members 44A to 44C respectively hold the peripheral surface of the mirror M2 at three points, for example, at three equally spaced points in angular intervals of 120 degrees. The mirror holding members 44A to 44C are substantially U-shaped so that the rigidity of the mirror holding members 44A to 44C in the radial direction of the inner ring 42 is low.

The mirror holding members 44A to 44C each include a mechanical clamp mechanism to clamp a flange portion (not shown) extending from the periphery of the mirror M2. The positional relationship between the mirror M2 and the inner ring 42 is maintained by the clamp mechanism.

The three equally spaced points along the periphery of the mirror M2 are held by the mirror holding members 44A to 44C, which have low rigidity in the radial direction of the inner ring 42. Therefore, even if thermal expansion of the mirror M2 occurs, the mirror M2 will thermally expand in a substantially equal manner in various directions along the XY plane. Accordingly, the mirror M2 after the thermal expansion is able to keep its outline shape similar to the original shape of the mirror M2.

The parallel link mechanism 41 is a parallel link mechanism of a so-called Stewart platform type, having six degrees of freedom and including six telescopic links 110.

The parallel link mechanism 41 includes an outer ring 48 serving as a base arranged on the inner surface of the barrel unit 152a, a drive mechanism 46 fixed to the outer ring 48, and an inner ring 42 constituting an end effector moved by the drive mechanism 46. The outer ring 48 is a circular annular member arranged on a circular annular projecting portion projecting inward from an upper end of the barrel unit 152a by means of three adjustment washers (not shown). The inner ring 42, which is a circular annular member having a diameter slightly smaller than that of the outer ring 48, is arranged below the outer ring 48. The drive mechanism 46, which connects the outer ring 48 and the inner ring 42, drives the inner ring 42 in directions of the six degrees of freedom relative to the outer ring 48.

The drive mechanism 46 includes six links 110, each having one end connected to the outer ring 48 and the other end connected to the inner ring 42 by a spherical pair. As shown in FIG. 5, each link 110 has a first shaft member 113 and a second shaft member 115 connected or coupled to the first shaft member 113. One end (the upper end) of the first shaft member 113 is attached to the outer ring 48 by a ball joint 111.

The other end (the lower end) of the second shaft member 115 is attached to the inner ring 42 by a ball joint 112 so as to form a spherical pair.

Three drive mechanisms 46A, 46B, and 46C are formed by three pairs of links 110, and the three drive mechanisms 46A, 46B, and 46C are arranged at equal angular intervals of 120 degrees. In each of the drive mechanisms 46A, 46B and 46C, the distance between the ball joints 111 on the side of the outer ring 48 is relatively large, while the distance between the ball joints 112 on the side of the inner ring 42 is relatively small. In each of the links 110, at least either one of the second shaft member 115 and the first shaft member 113 includes an actuator for changing the length of the link 110, that is, the distance between the upper end of the first shaft member 113 and the lower end of the second shaft member 115. The actuator may be, for example, a direct-acting fluid cylinder, a solenoid, a compact linear motor, or a piezoelectric element. The first embodiment uses a piezoelectric element. The actuator is controlled by a drive circuit (not shown). This drive circuit controls the six actuators without stress, and the inner ring 42 is controlled to a predetermined attitude with six degrees of freedom.

The structure of the mirror holding mechanisms for the mirrors M1 and M3 to M6 is substantially the same as that of the mirror holding mechanism 92 for the mirror M. However, the structure of the mirror holding mechanisms for the mirrors M1 to M6 may be changed as required in accordance with conditions such as the locations, shapes, and orientations of the mirrors M1 to M6, and the position of the light path. The mirror holding mechanism 92 for the mirror M2 is not restricted to the example shown in FIGS. 5 and 6. For example, in the mirror holding mechanism 92 shown in FIG. 5, the reflection surface of the mirror M2 is located at the lower side. Therefore, the inner ring 42 is arranged in the rear direction (+Z direction, or in the upper side as viewed in FIG. 5) of the reflection surface, and the links 110 are arranged further above the inner ring and connected to the lower end of the outer ring 48, which is located further above. However, the outer ring 48 may be arranged on the periphery of the lower end of the barrel unit 152a, the link mechanisms may be arranged above the outer ring 48, and the inner ring 42 may be arranged further above the link mechanisms. The mirror M2 may be arranged above the inner ring 42 instead of on the lower end of the inner ring 42.

In the case of the mirror holding mechanisms for holding the mirrors M3 and M4 separated from the central axis of the barrel 52, the inner ring 42 and the outer ring 48 need not have a circular annular shape along the barrel 52 but may have other shapes as long as dynamic conditions, which will be described later, are satisfied. For example, the inner ring 42 and the outer ring 48 may have an elliptical shape or semicircular shape biased toward one side or a shape including a cutaway portion so as not to obstruct the light path.

When the inner ring 42 and the outer ring 48 do not have a circular annular shape, the links 110 need not be arranged at equal angular intervals of 120 degrees relative to the center of the inner ring 42 or the outer ring 48.

EUVL requires an optical apparatus capable of stably holding optical elements. When using EUV light, in particular, the accuracy of EUVL is susceptible to fine vibrations which would not pose a significant problem in the prior art. The present inventor has developed an optical apparatus configured by placing importance on dynamic conditions of the optical apparatus instead of focusing only on the optical performance and the productivity as in the prior art. The dynamic structure of optical apparatuses according to first to twelfth embodiments of the present invention will now be described.

Figure 7:
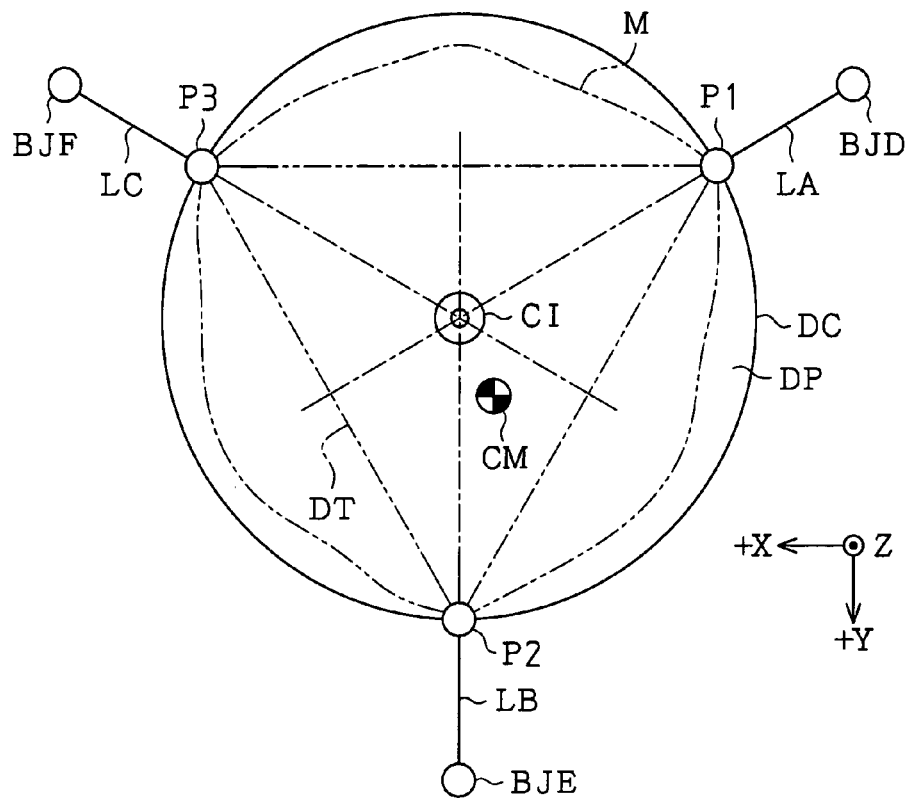
FIG. 7 is a schematic diagram of the mirror holding mechanism shown in FIG. 6.
Figure 8:
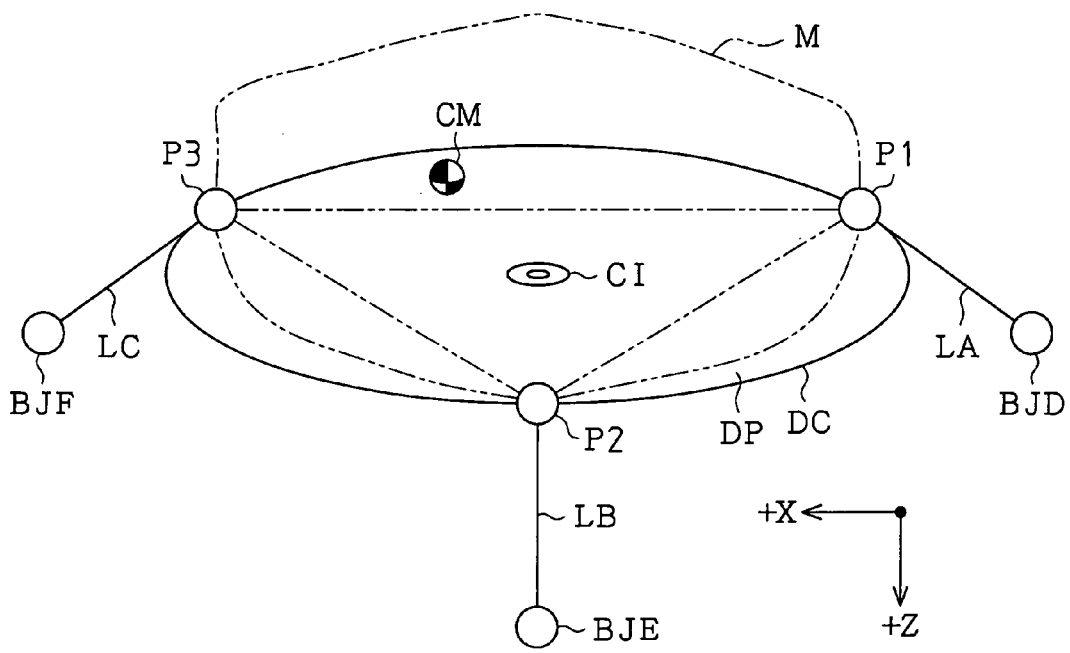
FIG. 8 is a schematic diagram of the mirror holding mechanism shown in FIG. 6.

FIG. 7 is a simplified schematic diagram of the mirror holding mechanism 92 shown in FIG. 6, and FIG. 8 is a perspective view of FIG. 7. The three pairs of links 110 shown in FIGS. 7 and 8 are represented by three support members LA, LB, and LC. The two ball joints 112 located close to each other and included in each of the drive mechanisms 46A, 46B and 46C will be approximated as being at the intersection point of the two links 110 and represented as single support positions P1, P2, and P3. In the present invention, each support member has one set of links 110 included in each of the drive mechanisms 46A, 46B, and 46C of the first embodiment, and each support position includes a position on the optical element supported by one set of the links 110.

The outer ring 48 is omitted in these drawings. The ball joints 111 serving as a connection point between each pair of links 110 and the outer ring 48 are simplified as ball joints BJD, BJE, and BJF.

The mirror M2, the inner ring 42, and the mirror holding member 44 forms an optical unit. The optical unit can be considered as a single rigid body. In the following description, the optical unit will be referred to as a virtual rigid body M. Although the detailed shape of the virtual rigid body M is not shown, the dynamic center of mass (center of gravity) CM of the virtual rigid body M is shown in the drawings instead. Since it is assumed here that the gravity is uniform, the center of mass coincides with the center of gravity. A triangle having apexes located at the three support positions P1, P2 and P3 is defined as a "reference triangle DT." The circumcircle of the reference triangle is defined as a "reference circle DC." A plane including the three support positions P1, P2 and P3 is defined as a "reference plane DP." The geometric incenter CI of the reference triangle DT, specifically, the point defined by the intersection point of bisectors of the three apexes and located at an equal distance from the three sides of the reference triangle DT is indicated by a double circle.

An optical apparatus according to the present invention includes optical elements (M2 to M6) forming an asymmetrical shape with respect to the optical axis of the optical apparatus, optical element holding members (42 and 44) holding the optical elements, and at least three support members (LA, LB and LC) supporting the optical element holding members.

At least either the optical element holding members or the optical elements are configured such that weight of the virtual rigid body M is distributed substantially uniformly to the support members LA, LB and LC, or to the support positions P1, P2 and P3. The load of the virtual rigid body M is calculated taking into consideration the vertical gravity and rotational moment of the virtual rigid body M. The load of the virtual rigid body M is calculated by a method that is in accordance with indeterminate dynamics. The relative positions between the support positions P1, P2 and P3 and the center of mass CM of the virtual rigid body M are determined such that equal loads act on the support positions P1, P2 and P3. If only the weight in the Z-axis direction of the virtual rigid body M is considered as the load of the virtual rigid body M, the loads acting on the support positions P1, P2, and P3 become equal to each other and the static stability of the optical apparatus is improved when the center of mass CM of the virtual rigid body M is arranged on the Z-axis extending through the center of gravity (not shown) of the reference triangle DT.

In order to set the position of the center of mass CM of the virtual rigid body M at a predetermined position relative to the support positions P1, P2 and P3, the center of mass of at least either the optical element holding member or the optical element constituting the virtual rigid body M must be moved. Two methods for moving the center of mass will be described. The movement of the center of mass CM of the virtual rigid body M is similarly applicable to the second to twelfth embodiments.

In a first method, the position of the center of mass CM of the virtual rigid body M relative to the support positions P1, P2 and P3 is optimized by moving one or both of the elements constituting the virtual rigid body M, namely, the optical element holding member and the optical element. For example, in the first embodiment, the optical holding members (the inner ring 42 and the mirror holding member 44) and the optical element (the mirror M2) are relatively moved by the links 110.

The elements to be moved are selected from "only the mirror M2," the combination of "the mirror M2 and the mirror holding member 44," or the combination of "the mirror M2, the mirror holding member 44, and the inner ring 42." When only the mirror M2 is moved, the position for holding the mirror M2 with the mirror holding member 44 is changed if there is a gap between the flange portion of the mirror M2 and the mirror holding member 44. If there is no gap between the flange portion of the mirror M2 and the mirror holding member 44, the shape of the flange portion of the mirror M2 is changed. In the first method, the center of mass CM of the virtual rigid body M is moved basically by changing only the positions of the component elements.

In a second method, the positions of the support positions P1, P2 and P3 are optimized according to the position of the center of mass CM of the elements constituting the virtual rigid body M. In this case, the support positions P1, P2 and P3 are not arranged at equal intervals.

A third method will be described. The position, attitude, and shape of each optical element are configured strictly in accordance with the requirements for the projection optical system PO. For example, as for the mirror M2 in the first embodiment, the optical element and optical element holding member are both difficult to move since the optical conditions such as the position and attitude of the reflection surface of the main body portion M2a, the position of the cutaway portion M2b, and the position of the inner ring 42 are determined. If movement of at least either one of the optical element and the optical element holding member exceeds the movable range of the links 110 serving as the support member, the necessary control for the alignment adjustment may become impossible. In this case, the first method cannot be employed.

In the third method, in order to determine the position of the center of mass CM of the virtual rigid body M, the center of mass of the virtual rigid body M is moved by arranging a balance weight on at least either one of the optical element holding member and the optical element without moving either one of the optical element holding member and the optical element.

For example, in the case of the mirror M2 shown in FIG. 6, a projecting portion M2c is integrally formed on the rear surface (the surface opposite the reflection surface, the +Z side) of a substantially hexagonal main body portion M2a. The projecting portion M2c functions as a balance weight having a positive weight. The balance weight M2c is an unnecessary part that does not contribute to the optical demand or the demand for production efficiency. Considering the strength and strain, it is preferable that the rear surface of the mirror M2 be flat to meet the original optical demand. When the rear surface of the mirror M2 is flat, the mirror M2 does not assume a rotation symmetrical shape due to the presence of the cutaway portion M2b, and the center of mass of the mirror M2 is located at a position M2d spaced away from the cutaway portion M2b relative to the optical axis AX as shown in FIG. 6. This is an unbalanced state and instable relative to vibrations of the surrounding. To eliminate the unbalance, in the first embodiment, the balance weight M2c is formed integrally with the rear surface of the mirror M2 in the vicinity of the cutaway portion M2b. The balance weight M2c may be arranged at a position other than the rear surface of the mirror M2. For example, the balance weight M2c may be arranged on the flange portion (not shown) of the mirror M2 held by the mirror holding member 44. The balance weight M2c may be arranged at any position in the mirror M2 other than on the reflection surface as long as it does not obstruct the light path.

Further, by arranging a balance weight BW on the inner ring 42 constituting the optical element holding member, only the center of mass CM can be moved without moving the virtual rigid body M. The balance weight BW may be formed integrally with the inner ring 42. However, the balance weight BW may be a separate member attached to the inner ring 42.

(Effects of the First, Second and Third Methods)

The first and second methods can be implemented without significant changes to each member. The third method can be implemented without changing the original optical design and reduces the rotational moment about the center of mass M2d since the mass lies close to the center of mass M2d when the balance weight M2c is formed integrally with the mirror M2 serving as the optical element. Moreover, there will be no gas generating source preventing purging since an adhesive agent is not used. When the balance weight BW is arranged on the inner ring 42, processing is easy. Especially, when the balance weight BW is a separate member, the mass and the position are easily adjusted even after installation of the optical apparatus. Furthermore, since the inner ring functions as the end effector of the parallel link mechanism 41, it is preferred that the balance weight BW be arranged on the inner ring defining the center of motion in the Z-axis direction. Obviously, the balance weights M2b and BW may be arranged on both the optical element and the optical element holding member or both the mirror M2 and the inner ring 42. It is also possible to implement a method to fix a separate member to the optical element depending on the conditions. Further, although not shown in the drawings, the balance weight BW may be arranged on the mirror holding member 44 constituting the optical element holding member. The balance weight BW includes a "part having a positive mass" such as a projection and a "part having a negative mass" such as a recess or a cutaway portion. Implementation of the arrangement of the balance weight BW includes the addition of "the part having a positive mass" to the original structure and removal of part of the original structure, specifically, the formation of a recess or a cutaway portion.

In the optical apparatus according to the first embodiment, at least either one of the optical element holding member and the optical element is configured such that the mass of the virtual rigid body M is equally applied to the three support members LA, LB, and LC. The relative position between the center of mass CM of the virtual rigid body M and the support positions P1, P2, and P3 is adjusted. Thus, the weight balance of the optical apparatus is improved, and the load is prevented from acting on a specific support member in a biased manner. Thus the rotational moment of the virtual rigid body M is reduced, and the static stability and dynamic stability of the optical apparatus are improved. Although the support members LA, LB, and LC (links 110) are dynamic actuators, they may be static support members.

Figure 9:
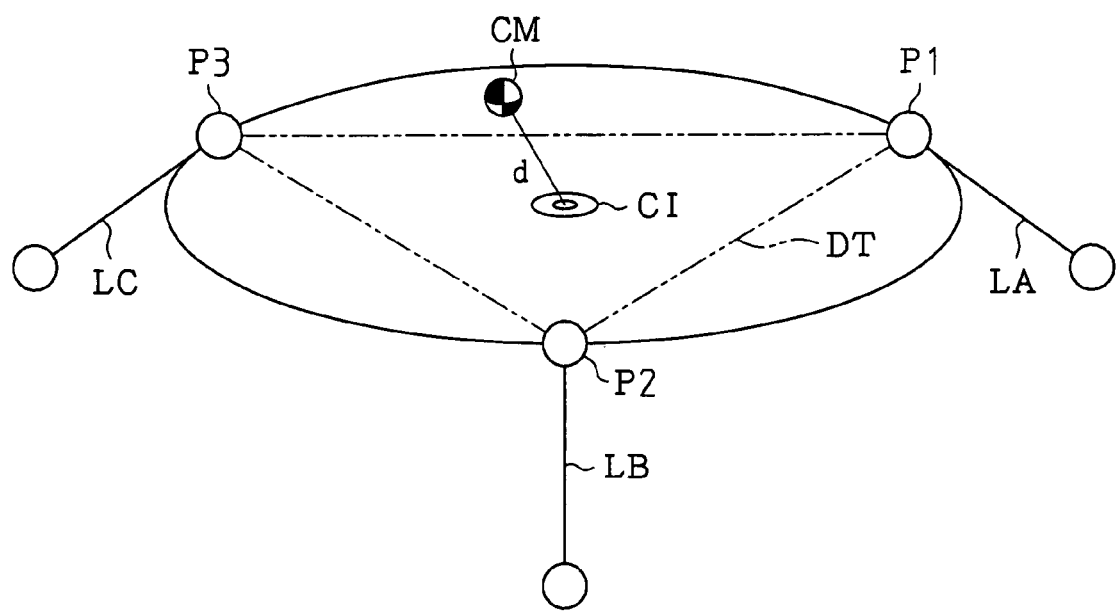
FIG. 9 is a schematic diagram showing an optical apparatus according to a second embodiment.

Referring to FIG. 9, an optical apparatus according to a second embodiment will be described. In the optical apparatus according to the second embodiment, at least either one of the optical element holding member and the optical element is configured such that the center of mass CM of the virtual rigid body M is located within a predetermined distance d from the incenter CI of a reference triangle DT having apexes defined by support positions P1, P2 and P3 of at least three support members LA, LB and LC that support the optical element holding member.

The "incenter CI of the reference triangle DT" is used as a reference because the incenter CI exhibits a minimum quantity of motion during movement of the reference triangle DT. This will now be described. The three support members LA, LB, and LC are driven to move the support positions P1, P2, and P3. This moves the optical element with six degrees of freedom. The six degrees of freedom refers to movement in the X, Y, and Z-axes directions and rotation about the X, Y, and Z-axes. Among the six degrees of freedom, consideration will be given herein to movement in the Z-axis direction and rotation about the X and Y-axes, for which the alignment adjustment is most required.

Since movement in the Z-axis direction is a linear motion, it is preferred that the weight of the virtual rigid body M be equally applied to the support positions P1, P2 and P3. In this case, it is preferred that the center of mass CM of the virtual rigid body M lies along a vertical direction of the reference triangle DT. It is ideal that the center of mass CM of the virtual rigid body M lies along a vertical direction from the incenter CI of the reference triangle DT.

Next, consideration is given to tilting of the optical element, namely, rotation θx and θy. In this case, the virtual rigid body M, or the optical element, is tilted by the support members LA, LB and LC respectively moving the support positions P1, P2 and P3 in the Z-axis direction. When any of the support members LA, LB and LC is moved in the Z direction, one of the support positions P1, P2 and P3 moves around a straight line connecting the two other support positions to tilt the optical element.

In the case of an optical element located at a position far separated from the optical axis AX of the projection optical system, for example, in the case of the mirror M3 or the mirror M4 (see FIG. 3), calculation for controlling the tilting of the optical element will be simple if the rotation axis lies on the optical axis of the optical element (the optical axis AX of the optical system). However, a great movement would be required to tilt the optical element since the optical element is far from the optical axis AX. With a telescopic parallel mechanism having actuators using piezoelectric elements, one or two actuators must be extended while contracting the remaining actuators in order to tilt the optical element to a large extent since the stroke of the actuators is limited. Accordingly, the optical element can be effectively rotated if the rotational axis of rotational motion of the optical element lies within the reference triangle DT defined by the three support positions P1, P2 and P3.

Movement in the X-axis direction of the virtual rigid body M, movement in the Y-axis direction, and rotation about the Z-axis, that is, movements in the XY-plane of the support positions P1, P2 and P3 are horizontal movements. Therefore, it is preferred that the center of mass CM of the virtual rigid body M be arranged in a plane containing the reference triangle DT.

It is believed from the above that the rotational axis of the tilting of the optical element by moving the support positions P1, P2 and P3 in the Z-axis direction often lies along the sides of or inside the reference triangle DT. Accordingly, in view of the control, it is most preferred that the center of mass CM of the virtual rigid body M be located proximal to the incenter CI that is equally distanced from the sides of the reference triangle DT.

The distance d between the center of mass CM and the incenter CI is smaller than a predetermined value that is determined based on the rotational moment of the virtual rigid body M, the rigidity of the support members, the tolerable vibrations, and the like. In order to set the distance d between the center of mass CM and the incenter CI to be smaller than the predetermined value, the first method for moving the optical element and optical element holding member and the second method for moving the center of mass CM with the balance weight may be employed.

In the optical apparatus according to the second embodiment, the center of motion of the virtual rigid body M approaches the center of mass CM of the virtual rigid body M. Therefore, the rotational moment of the virtual rigid body M associated with adjustment of the optical element is reduced, and the dynamic stability of the optical apparatus is improved.

Figure 10:
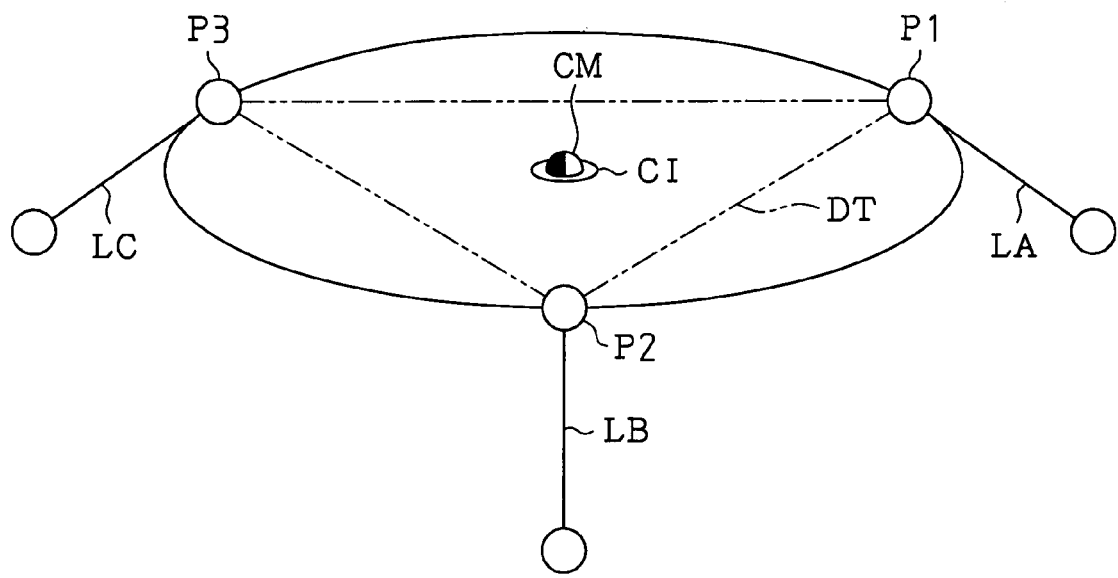
FIG. 10 is a schematic diagram showing an optical apparatus according to a third embodiment.

An optical apparatus according to a third embodiment will be now described with reference to FIG. 10. In the optical apparatus according to the third embodiment, at least either one of the optical element holding member and the optical element constituting the virtual rigid body M is configured such that the center of mass CM of the virtual rigid body M coincides with the incenter CI of a reference triangle DT having apexes defined by the support positions P1, P2 and P3 of the support members LA, LB and LC (distance d=0).

In the optical apparatus of the third embodiment, the center of mass CM that is most preferable as the center of rotational motion coincides with the incenter CI of the reference triangle DT that defines the actual center of motion. Therefore, the third embodiment has dynamic stability that is most improved and superior static stability because unnecessary rotational moment caused by external vibrations is unlikely to occur. Thus, the third embodiment is the most desirable embodiment.

Optical apparatuses according to fourth to eighth embodiments will be described with reference to FIGS. 11 to 15. In the fourth to eighth embodiments, the center of mass CM of the virtual rigid body M, the intersection point PI of a perpendicular line extending downward from the center of mass CM to the reference plane DP, and the support positions P1, P2 and P3 (reference triangle DT) of the support members LA, LB and LC have different positional relationships.

Figure 11:
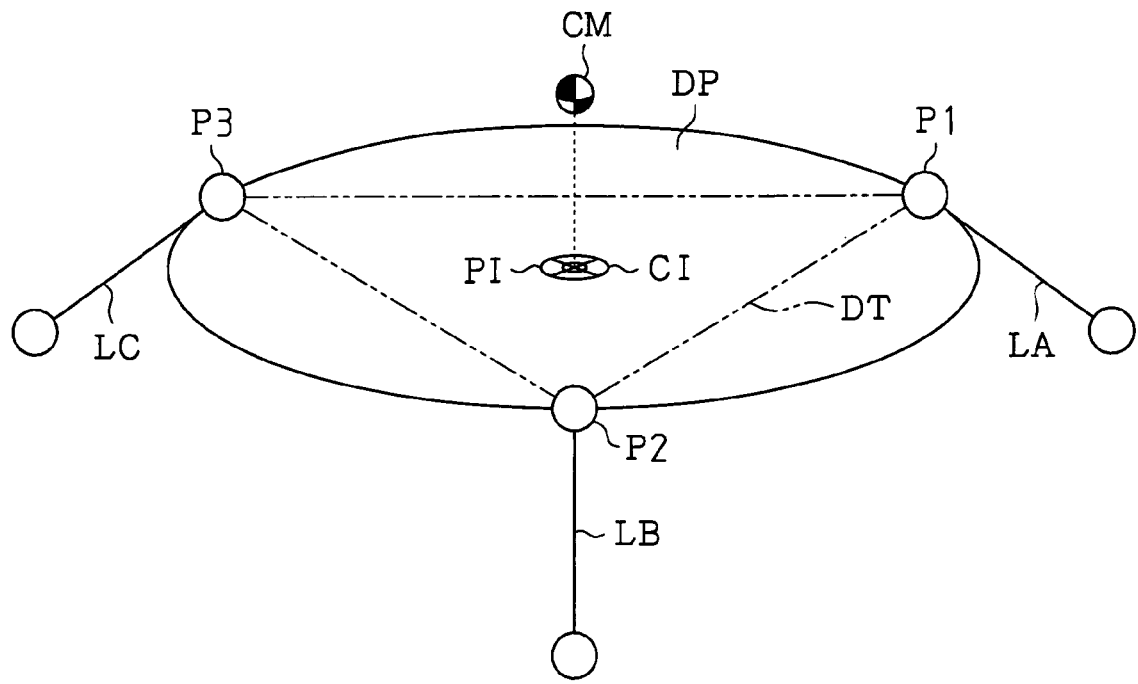
FIG. 11 is a schematic diagram showing an optical apparatus according to a fourth embodiment.

In the optical apparatus according to the fourth embodiment, as shown in FIG. 11, the intersection point PI coincides with the incenter CI of the reference triangle DT. In this structure, weights applied to the support positions P1, P2 and P3 take the same direction in the Z-axis direction. Thus, the loads applied to the support positions P1, P2 and P3 are substantially uniform. Accordingly, the static stability and the dynamic stability are improved.

Figure 12:
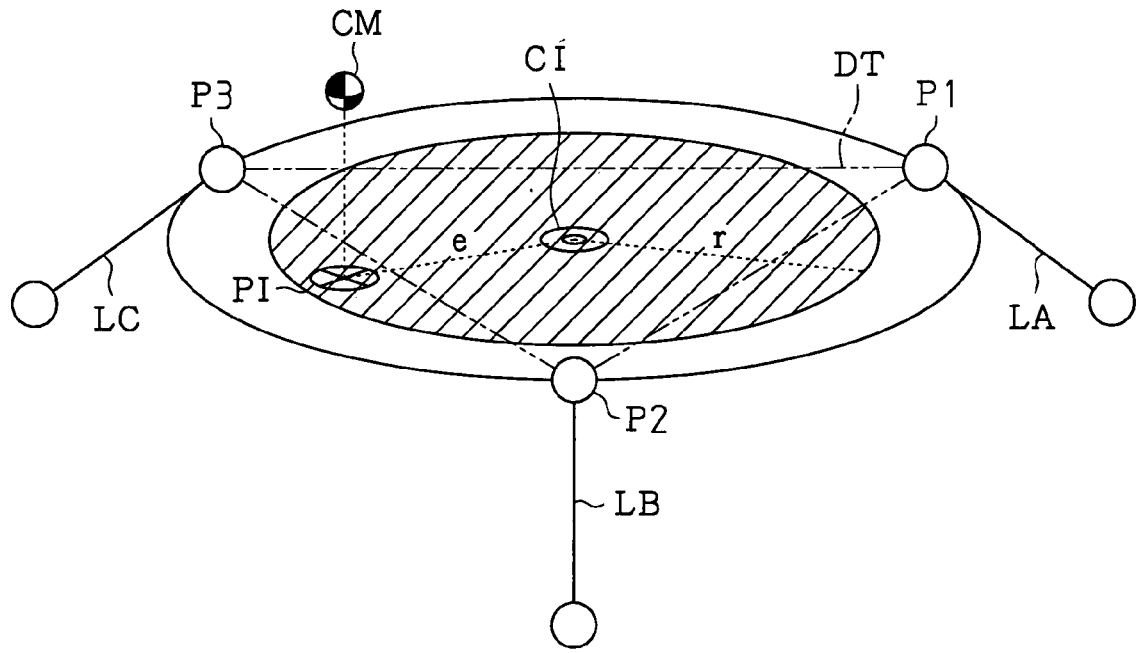
FIG. 12 is a schematic diagram showing an optical apparatus according to a fifth embodiment.

An optical apparatus according to the fifth embodiment will be described with reference to FIG. 12. In the optical apparatus according to the fifth embodiment, the distance e between the intersection point PI and the incenter CI of the reference triangle DT is smaller than a predetermined distance r.

Since the intersection point PI is not always within the reference triangle DT, weights applied perpendicularly to the support positions P1, P2 and P3 are not always in the same direction in the vertical direction (Z-axis direction in the first embodiment). However, the moment of inertia of rotation θz about the Z-axis is reduced because the intersection point PI is close to the incenter CI. Additionally, there is less substantial difference among the weights applied perpendicularly to the support positions P1, P2 and P3. Thus, the moments of inertia of rotations θx and θy about the X-axis and the Y-axis are reduced. Accordingly, the optical apparatus has improved static stability and dynamic stability.

Figure 13:
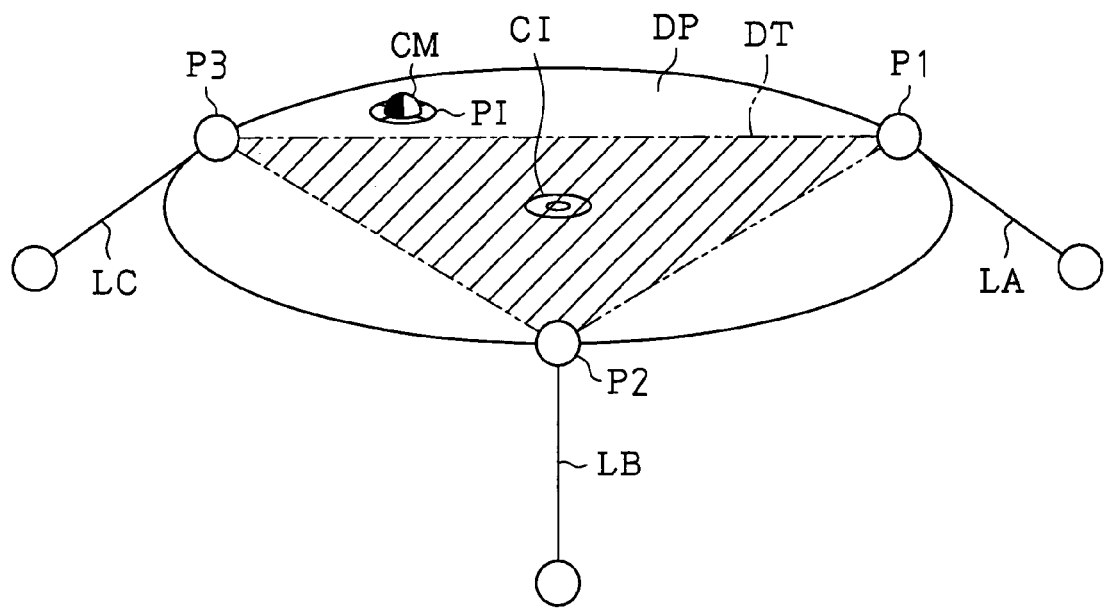
FIG. 13 is a schematic diagram showing an optical apparatus according to a sixth embodiment.

An optical apparatus according to the sixth embodiment will be described with reference to FIG. 13. In the optical apparatus according to the sixth embodiment, the intersection point PI is located in the reference plane DP. The intersection point PI may be either inside or outside the reference triangle DT.

In this structure, no moment of rotations θx and θy about the X-axis and the Y-axis is generated when the virtual rigid body M is moved in the X-axis and Y-axis directions. This improves the static stability and dynamic stability of the optical apparatus.

Figure 14:
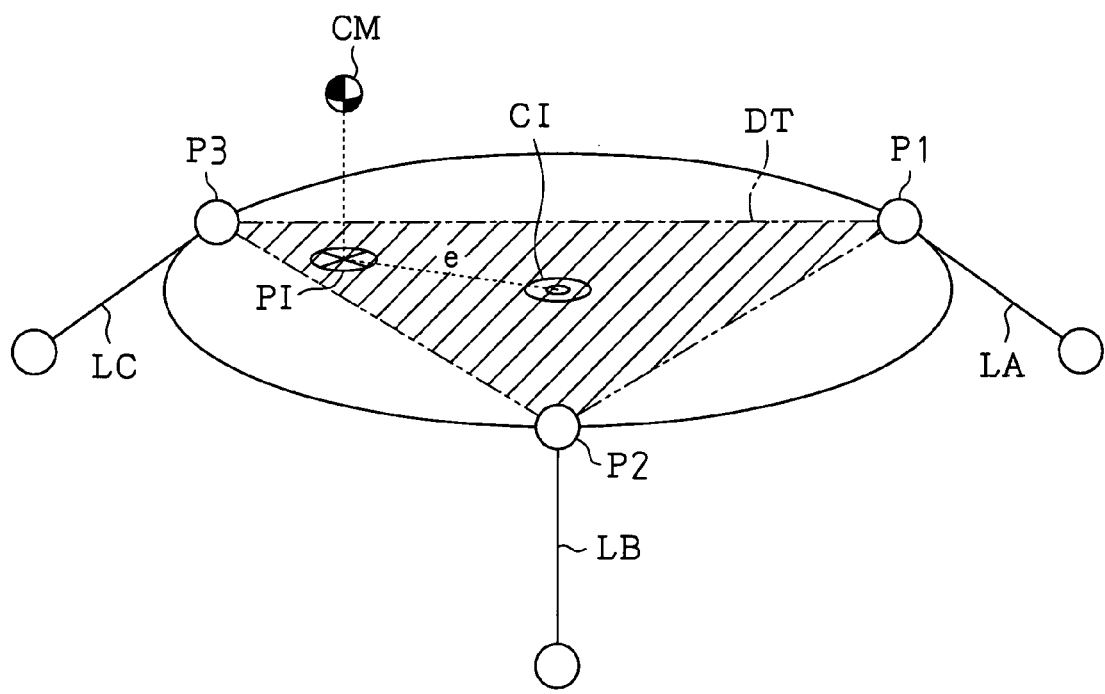
FIG. 14 is a schematic diagram showing an optical apparatus according to a seventh embodiment.

An optical apparatus according to the seventh embodiment will now be described with reference to FIG. 14. The optical apparatus according to the seventh embodiment is configured such that the center of mass CM of the virtual rigid body M is located above a reference plane DP of a reference triangle DT having apexes defined by the support positions P1, P2 and P3 of the support members LA, LB and LC. Thus, the intersection point PI lies within the reference triangle DT. The distance e between the intersection point PI and the incenter CI is set to be smaller than a predetermined distance.

In this structure, the intersection point PI is located within the reference triangle DT. Thus, the mass of the virtual rigid body M is either in the upper direction (the direction towards the reticle R) or the lower direction (the direction towards the wafer W) relative to all the support positions P1, P2 and P3. This improves the static stability and the dynamic stability. Additionally, since the distance e between the intersection point PI and the incenter CI is set to be smaller than the predetermined distance, the moment of inertia particularly for θz is reduced and the stability is enhanced.

Figure 15:
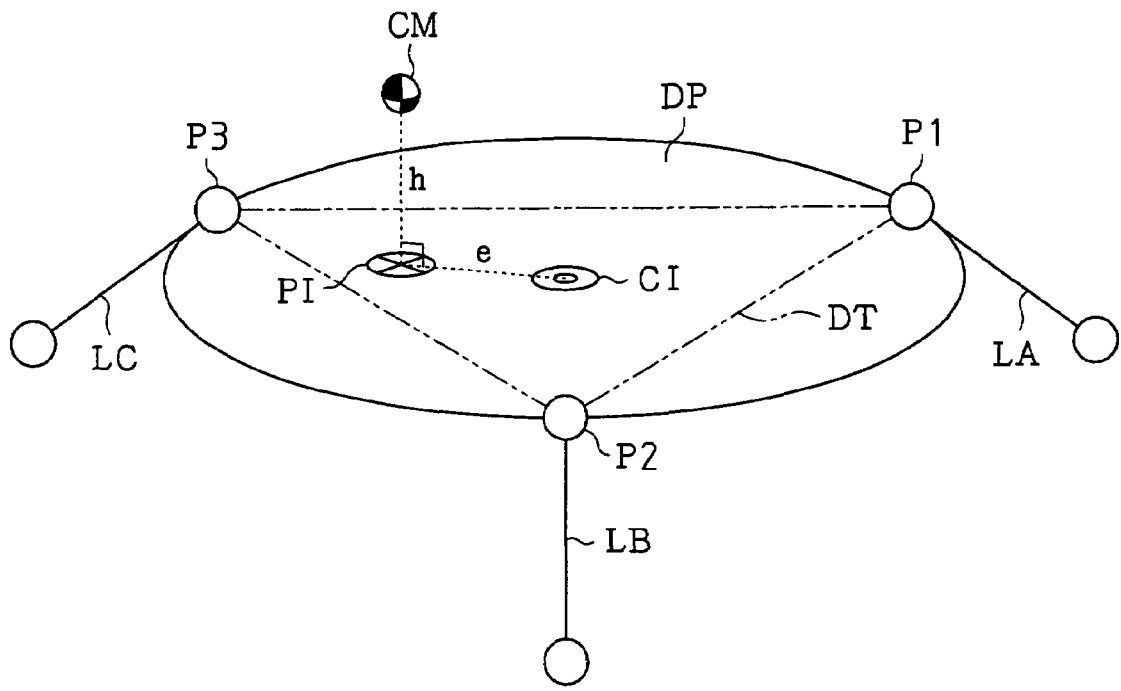
FIG. 15 is a schematic diagram showing an optical apparatus according to an eighth embodiment.

An optical apparatus according to the eighth embodiment will be described with reference to FIG. 15. In the optical apparatus of the eighth embodiment shown in FIG. 15, the height h of the center of mass CM of the virtual rigid body M from an intersection point PI of a vertical line extending downward from the center of mass CM to the reference plane DP, that is, the distance between the reference plane DP and the center of mass CM is smaller than a predetermined value. In this structure, the distance between the reference plane DP containing the center of motion and the center of mass CM becomes close. This improves the static stability and the dynamic stability. Particularly, the stability against displacement in the X-axis and Y-axis directions is improved as the height h becomes smaller.

Figure 16:
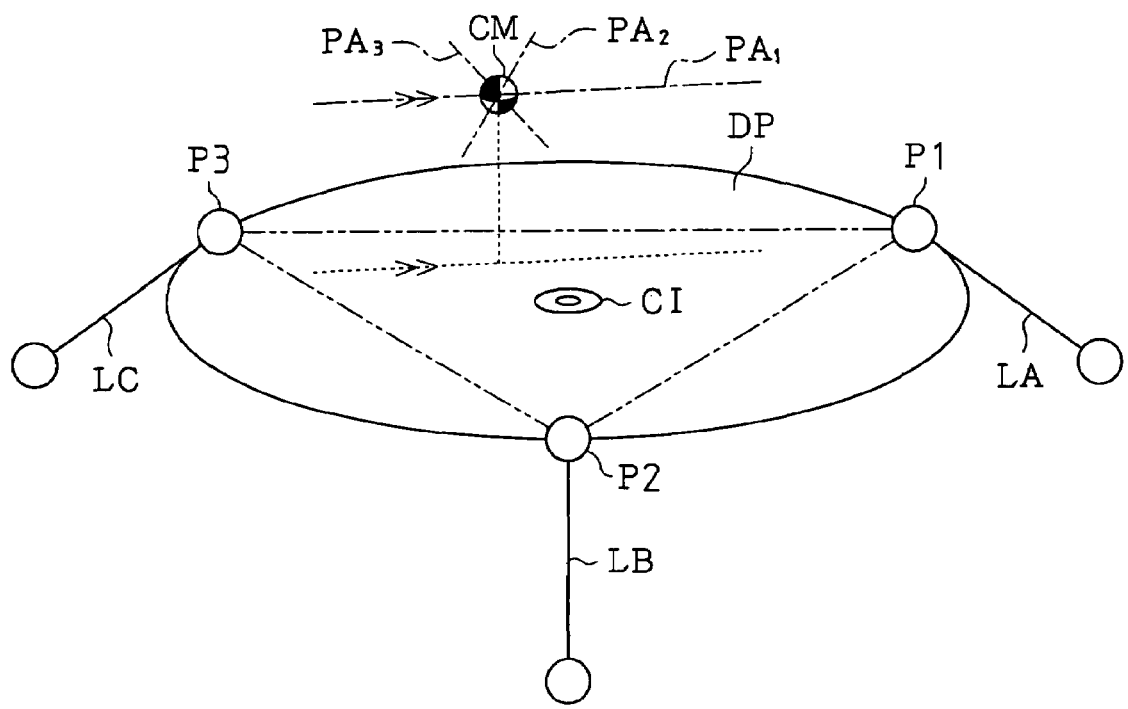
FIG. 16 is a schematic diagram showing an optical apparatus according to a ninth embodiment.

An optical apparatus according to the ninth embodiment will be described with reference to FIG. 16. In the ninth embodiment, as shown in FIG. 16, at least either one of the optical element holding member and the optical element is configured such that at least one of inertia principal axes $PA_1$, $PA_2$ and $PA_3$ of the virtual rigid body M extends parallel to the reference plane DP containing support positions P1, P2 and P3 of at least three support members LA, LB and LC.

The "inertia principal axis" refers to a principal axis of an inertial ellipsoid. A homogenous object has three inertia principal axes that are orthogonal to one another. The "ellipsoid of inertia" is a quadratic surface representing the shape of the tensor of inertia of a rigid body or mass system. When the moments of inertia are represented by $I_x$, $I_y$ and $I_z$, and the products of inertia are represented by $I_{xy}$, $I_{yz}$ and $I_{zx}$, the ellipsoid of inertia is represented by $I_x x^2 + I_y y^2 + I_z z^2 - 2I_{xy}xy - 2I_{yz}yz - 2I_{zx}zx = 1$.

When the center of mass CM (center of gravity) coincides with the origin O of a coordinate system, the products of inertia is represented by $I_{xy} = \int xy\,dm$, $I_{yz} = \int yz\,dm$, and $I_{zx} = \int zx\,dm$, where dm is an infinitesimal mass of a rigid body. When the coordinate axis is matched with the inertia principal axis (central principal axis), in other words, when a central ellipsoid is employed, the product of inertia at the inertia principal axis is eliminated.

In this rigid body, the rotational motion about the inertia principal axis has a zero product of inertia. Therefore, no rotational motion occurs in a different direction from the direction of the initially applied moment, and the rotation is stabilized. In other words, the dynamic stability is improved. On the contrary, when the rotational axis of the rotational motion does not coincide with the inertia principal axis, the product of inertia is not zero. Therefore, rotational motion occurs in a direction differing from the direction of the initially applied moment, and the rotational motion is instable. In other words, the dynamic stability is impaired.

As described above, at least one of the inertia principal axes $PA_1$, $PA_2$ and $PA_3$ of the virtual rigid body M, for example the inertia principal axis $PA_1$ is parallel to the reference plane DP. Thus, the virtual rigid body M is in a state similar to static unbalance of a rotating machine (JIS B 0123). The motion of the virtual rigid body M parallel to at least the inertia principal axis $PA_1$ is unbalanced in only one direction, and is thus relatively stabilized.

Figure 17:
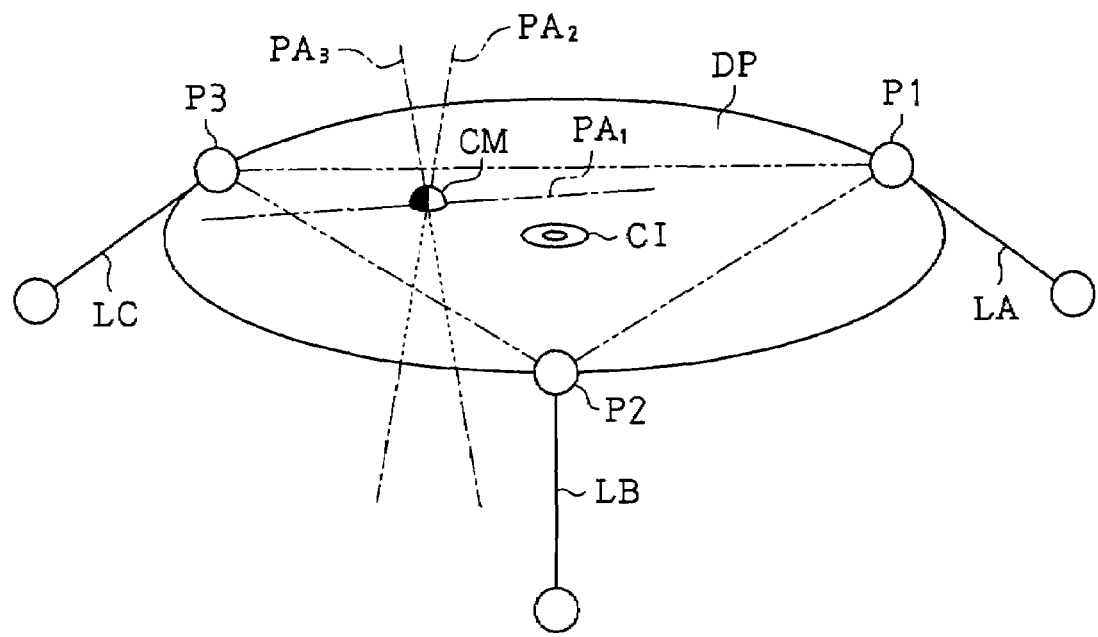
FIG. 17 is a schematic diagram showing an optical apparatus according to a tenth embodiment.

An optical apparatus according to the tenth embodiment will be described with reference to FIG. 17. In the optical apparatus according to the tenth embodiment, at least either one of the optical element holding member and the optical element is configured so that at least one of the inertia principal axes $PA_1$, $PA_2$ and $PA_3$ of the virtual rigid body M, for example, the inertia principal axis $PA_1$ lies along the reference plane DP. In this structure, when motion of the virtual rigid body M is rotational motion about at least the inertia principal axis $PA_1$, the motion of the virtual rigid body M is extremely stable. This indicates superior dynamic stability. The same can be said for the case in which motion of the virtual rigid body M is rotational motion about the other inertia principal axes $PA_2$ and $PA_3$. It is believed that for an optical apparatus, the virtual rigid body M is often rotated about a rotational axis close to the XY plane. Preferably, the angle is small between the reference plane DP and any one of the other inertia principal axes $PA_2$ and $PA_3$.

It is further preferable that two of the three inertia principal axes $PA_1$, $PA_2$ and $PA_3$ lie along on the reference plane DP. This structure further improves the dynamic stability of the optical apparatus.

Figure 18:
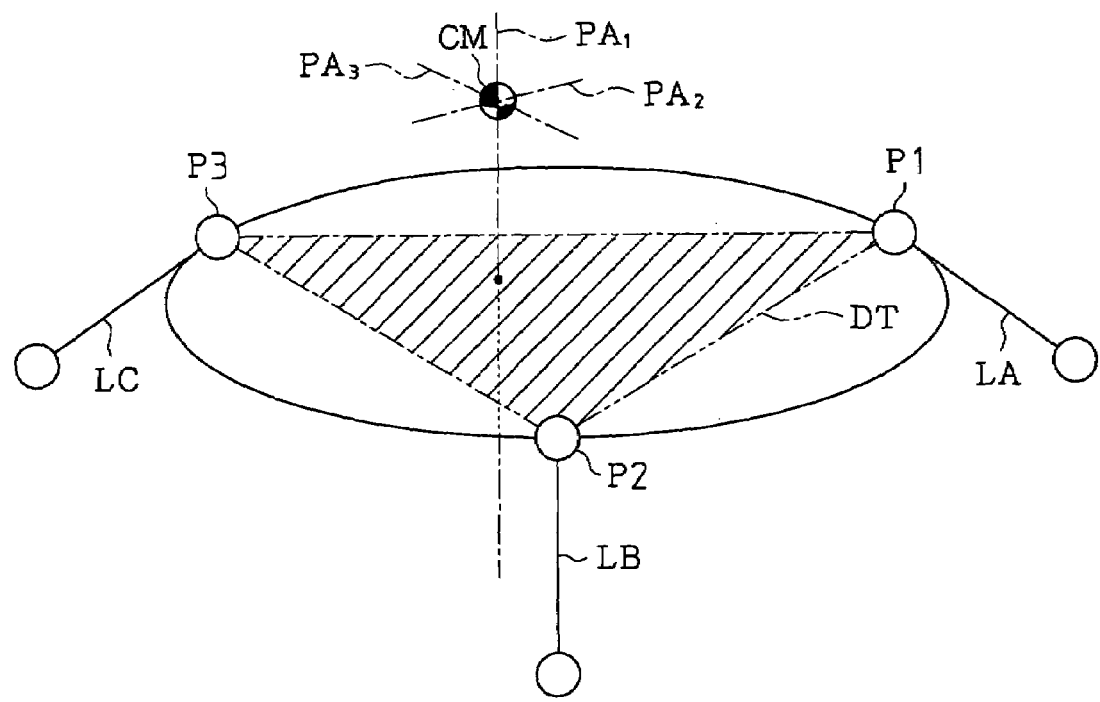
FIG. 18 is a schematic diagram showing an optical apparatus according to an eleventh embodiment.

An optical apparatus according to the eleventh embodiment will now be described with reference to FIG. 18. In the optical apparatus according to the eleventh embodiment, at least either one of the optical element holding member and the optical element is configured such that at least one of the inertia principal axes $PA_1$, $PA_2$ and $PA_3$ of the virtual rigid body M, for example, the inertia principal axis $PA_1$ intersects with the reference triangle DT, which has apexes defined by the support positions P1, P2 and P3, within the reference triangle DT.

The inertia principal axis $PA_1$ extends through the reference triangle DT, which is likely to become the center of motion of the virtual rigid body M. Thus, the rotational motion about the inertia principal axis $PA_1$ is extremely stable, and the optical apparatus exhibits superior dynamic stability. When any of the inertia principal axes $PA_2$ and $PA_3$ extends through the reference triangle DT in addition to the inertia principal axis $PA_1$, the rotation of the optical apparatus is further stabilized.

Figure 19:
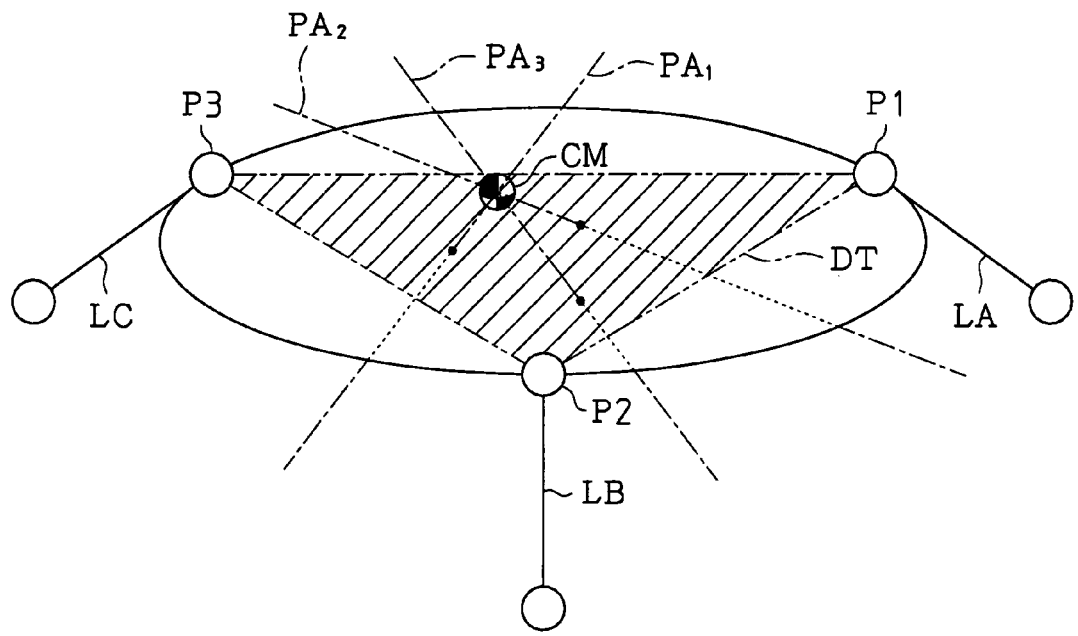
FIG. 19 is a schematic diagram showing an optical apparatus according to a twelfth embodiment.

An optical apparatus according to the twelfth embodiment is described with reference to FIG. 19. In the optical apparatus according to the twelfth embodiment, the inertia principal axes $PA_1$, $PA_2$ and $PA_3$ all intersect with the reference triangle DT within the reference triangle DT.

In this structure, the inertia principal axes $PA_1$, $PA_2$ and $PA_3$ all extend through the reference triangle DT, which is likely to become the center of motion of the virtual rigid body M. Therefore, the dynamic stability of the optical apparatus is further improved in comparison with the eleventh embodiment.

The optical apparatuses according to the first to twelfth embodiments are applicable to the barrel units 152a to 152e. A projection optical system PO having excellent static stability and dynamic stability can be obtained by using the barrel 52 including an optical apparatus according to any one of the first to twelfth embodiments.

Although the parallel link mechanism 41 of the preferred embodiments drives the mirrors held by the mirror holding members 44A, 44B, and 44C by moving the inner ring 42, the present invention is not limited to such a structure. For example, the inner ring 42 may be omitted, and the mirrors may be driven while the mirror holding members 44A, 44B, and 44C are respectively supported by the drive mechanisms 46A, 46B, and 46C of the parallel link mechanism 41.

When the projection optical system PO including the optical apparatus according to the present invention is used in a lithography operation for manufacturing a device, EUV light having a very short wavelength is reflected by the reflecting projection optical system. Thus, a fine pattern of a reticle R can be transferred with high accuracy onto shot regions of a wafer W without being affected by chromatic aberration. Specifically, a fine pattern having a minimum line width of about 70 nm can be transferred with high accuracy.

The present invention is not limited to a reflecting projection optical system using EUV light as exposure light and including six reflection optical elements (mirrors M1 to M6). For example, instead of six optical elements, there may be any number of optical elements. Further, the exposure light may be VUV light having a wavelength of 100 to 160 nm, such as $Ar_2$ laser (wavelength of 126 nm).

The present invention is also applicable to a catadioptric projection optical system including a lens and a reflection optical element. The present invention exhibits notable advantages when holding optical elements having a rotationally asymmetrical shape. However, when holding optical elements forming a rotation symmetrical shape, the present invention improves the property of the optical apparatus by taking the dynamic conditions of the present invention into account. Accordingly, the present invention exhibits most notable advantages in a reflecting projection optical system. However, the present invention is also applicable to a catadioptric projection optical system and a refraction projection optical system in which lenses with a rotation symmetrical shape are arranged coaxially. In such a case, sufficient advantages are exhibited.

In each of the above embodiments, as an example of a high accuracy optical apparatus, a projection exposure apparatus that uses EUV light having a wavelength of 11 nm as exposure light is employed. However, the optical apparatus may be a projection exposure apparatus using EUV light having a wavelength of 13 nm as the exposure light. In this case, the mirrors must have a multilayer reflection film having molybdenum (Mo) and silicon (Si) that are alternately superimposed to secure a reflectance of about 70% with respect to EUV light having a wavelength 13 nm.

The exposure light source is not limited to a laser-excited plasma light source and may be an SOR, a betatron light source, a discharged light source, or an X-ray laser.

In each of the above embodiments, the optical apparatus is included in a projection optical system constituting an exposure apparatus. However, the present invention may be an optical apparatus included in an illumination optical system. The optical apparatus of the present invention may be employed in apparatuses other than the exposure apparatus having optical elements in a barrel, while obtaining the same advantages as the above embodiments.

The present invention may also be applied to an optical apparatus having no barrel, for example, an optical apparatus that holds a single mirror functioning as the optical element, while also exhibiting notable advantages.

The parallel link mechanism in the first embodiment is of the Stewart platform type having a telescopic actuator arranged between joints. The ball joints 112 connecting a set of two links 110 to the side of the inner ring 42 constituting the end effector are located close to each other, while the ball joints 111 on the side of the outer ring 48 constituting the base are widely separated. On the other hand, the ball joints 111 on the side of the inner ring 42 may be widely separated, while those on the side of the outer ring 48 are located close to each other. In this case, the ball joints 112 on the side of the inner ring 42 constituting the virtual rigid body M are arranged at six positions in a dispersed manner. However, even if the ball joints 112 of a set of two parallel links are separated from each other, each set of two parallel links correspond to a single support member in the present invention, and a reference triangle DT is defined by median points between the two ball joints 112 serving as the support positions P1, P2 and P3.

When the inner ring 42 is supported by the links 110, which serve as support members, at six support positions, one of the links 110 in each set of two links 110 may be selected to define the reference triangle DT.

In place of the telescopic parallel link mechanism, a direct-movement link mechanism having fixed base-side joints and moving along a straight line may be employed by using a fixed direct-movement actuator. Alternately, a rotation (articulate) link mechanism may be employed by using a fixed rotary actuator having base-side joints that rotate.

The optical element may be movably supported by a mechanism other than the parallel link mechanism 41. The motion of the optical element does not have to have six degrees of freedom. The present invention is applicable to any mechanism as long as the optical element and the optical element holding member are supported by means of at least three support members so as to be integrally movable with one or more degrees of freedom.

Figure 20:
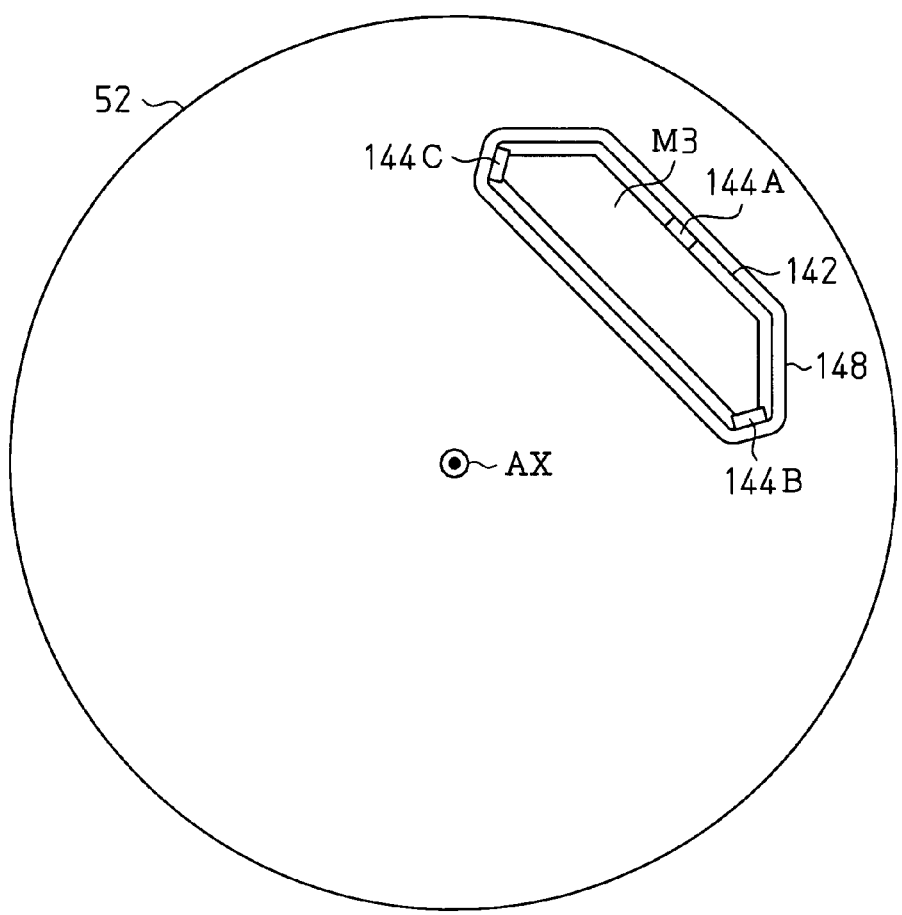
FIG. 20 is a plan view showing an optical apparatus of another example.

FIG. 20 is a schematic diagram showing an optical apparatus for supporting the mirror M3. In each of the above embodiments, the support position P1, P2 and P3 of the support members LA, LB and LC are arranged at equal angular intervals of substantially 120 degrees in the circular annular inner ring 42. In the example shown in FIG. 20, the optical element (mirror M3) is arranged in the periphery of the interior of the barrel 52, and the inner ring 142 and the outer ring 148 also have an irregular shape to avoid obstructing the light path. Mirror holding members 144A to 144C holding the mirror M3 are also not arranged at equal angular intervals. The method described in the eleventh to twelfth embodiments is applicable even in such a structure.

The center of mass CM of the virtual rigid body M does not necessarily have to be determined using the incenter CI as a reference and may be determined using the intersection point between the optical axis AX and the reference plane DP, the circumcenter of the reference triangle DT, or the center of gravity as a reference. For example, when the optical axis AX is separated from the optical element as shown in FIG. 20, control calculations are simplified when using the intersection point with the optical axis AX as a reference. However, the actuator is required to have a large stroke for actual operation. If the stroke is large enough, the intersection point with the optical axis AX may be used as a reference. However, in this structure, the actuator stroke is small particularly when a piezoelement or the like is used. Accordingly, it is reasonable that the incenter CI be used as the reference. Further, in order to place importance on static stability, it is also possible to set the center of mass CM of the virtual rigid body M using the center of gravity of the reference triangle DT as a reference. The selection of these structures depends on the requirements for the optical element.

According to the present invention as described above, the optical apparatus such as the mirror holding mechanism 92 includes the parallel link mechanism 41, which improves not only the static stability but also the dynamic stability of the mirrors M1 to M6, which are optical elements. By using the exposure apparatus 10 including the barrel 52 having the optical apparatus of the present invention, semiconductor devices having high accuracy, which is not affected by vibrations, may be manufactured with high yield.

The invention claimed is:

1. An optical apparatus having an optical axis, the optical apparatus comprising:
    an optical element formed to have an asymmetrical shape with respect to the optical axis so as not to obstruct a light path;
    an optical element holding member that holds the optical element; and
    at least three support members that support the optical element holding member,
        wherein at least either one of the optical element holding member and the optical element is configured so that total weight of the optical element holding member and the optical element is applied substantially equally to the at least three support members.

2. The optical apparatus according to claim 1, wherein the at least three support members respectively support the optical element holding member at least three support positions, and center of mass of the optical element holding member and the optical element is located within a predetermined distance from the incenter of a triangle formed by three of the at least three support positions.

3. The optical apparatus according to claim 1, wherein the at least three support members respectively support the optical element holding member at least three support positions, and center of mass of the optical element holding member and the optical element coincides with the incenter of a triangle formed by three of the at least three support positions.

4. The optical apparatus according to claim 1, wherein the at least three support members respectively support the optical element holding member at least three support positions, and at least either one of the optical element holding member and the optical element is configured such that a reference plane containing the three support positions, center of mass of an optical unit including the optical element holding member and the optical element with respect to the reference plane, and an intersection point between a perpendicular of the reference plane extending through the center of mass and the reference plane have a predetermined positional relationship relative to a triangle formed by the three support positions.

5. The optical apparatus according to claim 4, wherein the intersection point coincides with the incenter of the triangle.

6. The optical apparatus according to claim 4, wherein the intersection point is located within a predetermined distance from the incenter of the triangle.

7. The optical apparatus according to claim 4, wherein the intersection point is located inside the triangle.

8. The optical apparatus according to claim 1, wherein the at least three support members respectively support the optical element holding member at least three support positions, and at least either one of the optical element holding member and the optical element is configured such that center of mass of the optical element holding member and the optical element located on a reference plane containing a triangle formed by three of the at least three support positions.

9. The optical apparatus according to claim 1, wherein the at least three support members respectively support the optical element holding member at least three support positions, and at least either one of the optical element holding member and the optical element is configured such that at least one of inertia principal axes of an optical unit including the optical element holding member and the optical element is parallel to a reference plane containing the at least support positions.

10. The optical apparatus according to claim 1, wherein the at least three support members respectively support the optical element holding member at least three support positions, and at least either one of the optical element holding member and the optical element is configured such that at least one of inertia principal axes of an optical unit including the optical element holding member and the optical element located on a reference plane containing the at least three support positions.

11. The optical apparatus according to claim 1, wherein the at least three support members respectively support the optical element holding member at least three support positions, and at least either one of the optical element holding member and the optical element is configured such that at least one of inertia principal axes of an optical unit including the optical element holding member and the optical element intersects with a triangle defined by three of the at least three support positions.

12. The optical apparatus according to claim 11, wherein the inertia principal axes all intersect with the triangle.

13. The optical apparatus according to claim 1, wherein at least either one of the optical element holding member and the optical element includes a balance weight.

14. The optical apparatus according to claim 13, wherein the balance weight is integrally formed with at least either one of the optical element holding member and the optical element.

15. A barrel comprising:
an optical apparatus according to claim 1.

16. An exposure apparatus for exposing an image of a pattern formed on a mask onto a substrate through a projection optical system, the exposure apparatus comprising a barrel according to claim 15.

17. A device manufacturing method including a lithography operation, the method comprising:
performing exposure in the lithography operation by using an exposure apparatus according to claim 16.

18. A device manufacturing method including a lithography operation, the method comprising:
performing exposure in the lithography operation by using an exposure apparatus according to claim 17.

19. An optical apparatus having an optical axis, the optical apparatus comprising:
an optical element formed to have an asymmetrical shape with respect to the optical axis so as not to obstruct a light path;
an optical element holding member that holds the optical element;
at least three support members that support the optical element holding member; and
a balance weight provided to at least one of the optical element holding member and the optical element.

20. The optical apparatus according to claim 19, wherein the balance weight adjusts weight balance of at least one of the optical element holding member and the optical element such that the weight of the optical element holding member and the optical element is distributed and applied substantially equally to the at least three support members.

21. The optical apparatus according to claim 20, wherein the balance weight is a projecting portion integrally formed with at least one of the optical element holding member and the optical element.

22. The optical apparatus according to claim 20, wherein the balance weight is a cutaway portion formed in at least part of the optical element holding member and the optical element.

23. The optical apparatus according to claim 19, wherein at least either one of the optical element holding member and the optical element is configured such that weight of the optical element held by the optical element holding member is applied substantially equally to the at least three support members.

24. A barrel comprising:
an optical apparatus according to claim 19.

25. An exposure apparatus for exposing an image of a pattern formed on a mask onto a substrate through a projection optical system, the exposure apparatus comprising a barrel according to claim 24.

26. An optical apparatus having an optical axis, the optical apparatus comprising:
an optical element formed to have an asymmetrical shape with respect to the optical axis so as not to obstruct a light path;
an optical element holding member that holds the optical element; and
at least three support members that support the optical element holding member,
wherein the at least three support members are arranged at irregular intervals such that weight of the optical element holding member and the optical element is distributed substantially equally to the at least three support members.

27. A barrel comprising:
an optical apparatus according to claim 26.

28. An exposure apparatus for exposing an image of a pattern formed on a mask onto a substrate through a projection optical system, the exposure apparatus comprising a barrel according to claim 27.

29. A device manufacturing method including a lithography operation, the method comprising:
performing exposure in the lithography operation by using an exposure apparatus according to claim 28.

* * * * *